(12) United States Patent
Xie et al.

(10) Patent No.: US 9,318,552 B2
(45) Date of Patent: Apr. 19, 2016

(54) METHODS OF FORMING CONDUCTIVE CONTACT STRUCTURES FOR A SEMICONDUCTOR DEVICE WITH A LARGER METAL SILICIDE CONTACT AREA AND THE RESULTING DEVICES

(71) Applicant: GLOBALFOUNDRIES Inc., Grand Cayman (KY)

(72) Inventors: Ruilong Xie, Niskayuna, NY (US); William J. Taylor, Jr., Clifton Park, NY (US); Ajey Poovannummoottil Jacob, Watervliet, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/283,404

(22) Filed: May 21, 2014

(65) Prior Publication Data

US 2015/0340457 A1 Nov. 26, 2015

(51) Int. Cl.
*H01L 21/8238* (2006.01)
*H01L 21/8234* (2006.01)
*H01L 29/06* (2006.01)
*H01L 29/66* (2006.01)
*H01L 29/78* (2006.01)
*H01L 29/417* (2006.01)
*H01L 29/49* (2006.01)

(52) U.S. Cl.
CPC .... *H01L 29/0669* (2013.01); *H01L 21/823418* (2013.01); *H01L 21/823431* (2013.01); *H01L 21/823814* (2013.01); *H01L 21/823821* (2013.01); *H01L 29/41783* (2013.01); *H01L 29/41791* (2013.01); *H01L 29/6681* (2013.01); *H01L 29/66545* (2013.01); *H01L 29/66553* (2013.01); *H01L 29/785* (2013.01); *H01L 29/4966* (2013.01)

(58) Field of Classification Search
CPC ............... H01L 21/823814; H01L 21/823418; H01L 21/823821; H01L 21/823431; H01L 29/41783; H01L 29/41791; H01L 21/845; H01L 27/0824; H01L 27/1211; H01L 27/10879; H01L 29/66795; H01L 29/66787
See application file for complete search history.

(56) References Cited

U.S. PATENT DOCUMENTS

| 5,955,770 | A  | * | 9/1999  | Chan et al. ..................... 257/408 |
| 6,563,179 | B2 | * | 5/2003  | Pindl .............................. 257/382 |
| 2011/0272739 | A1 | * | 11/2011 | Lee et al. ....................... 257/192 |
| 2013/0288438 | A1 | * | 10/2013 | Jensen .................. H01L 21/268 438/197 |
| 2014/0117421 | A1 | * | 5/2014  | Seo et al. ....................... 257/288 |
| 2014/0151639 | A1 | * | 6/2014  | Chang et al. ..................... 257/27 |
| 2014/0273379 | A1 | * | 9/2014  | Tsai et al. ..................... 438/283 |

* cited by examiner

*Primary Examiner* — Phat X Cao
(74) *Attorney, Agent, or Firm* — Amerson Law Firm, PLLC

(57) ABSTRACT

One illustrative method disclosed herein includes, among other things, forming a first epi semiconductor material in a source/drain region of a transistor device, the first epi semiconductor material having a first lateral width at an upper surface thereof, forming a second epi semiconductor material on the first epi semiconductor material and above at least a portion of one of a gate cap layer or one of the sidewall spacers of the device, wherein the second epi semiconductor material has a second lateral width at an upper surface thereof that is greater than the first lateral width, and forming a metal silicide region on the upper surface of the second epi semiconductor material.

21 Claims, 29 Drawing Sheets

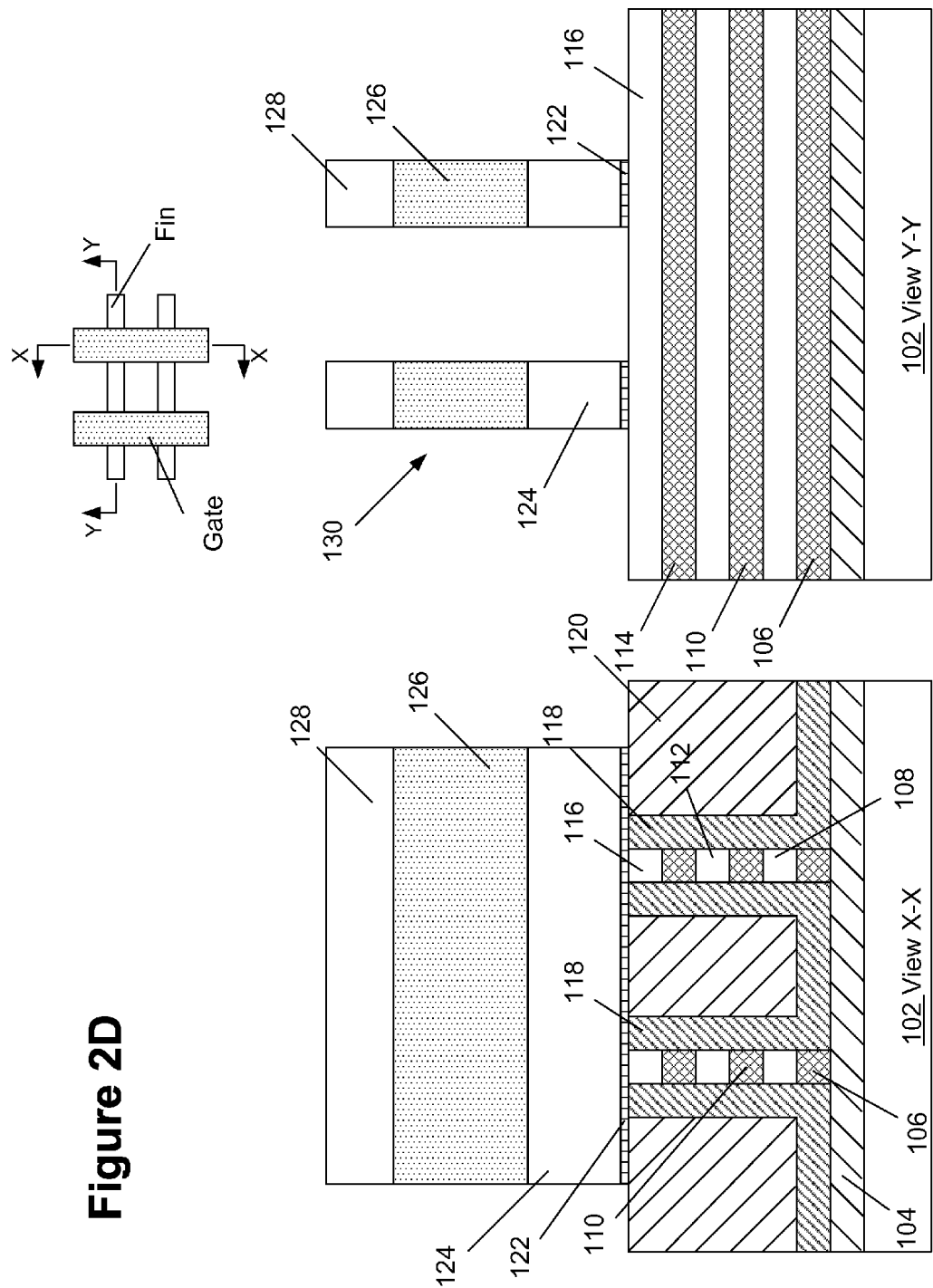

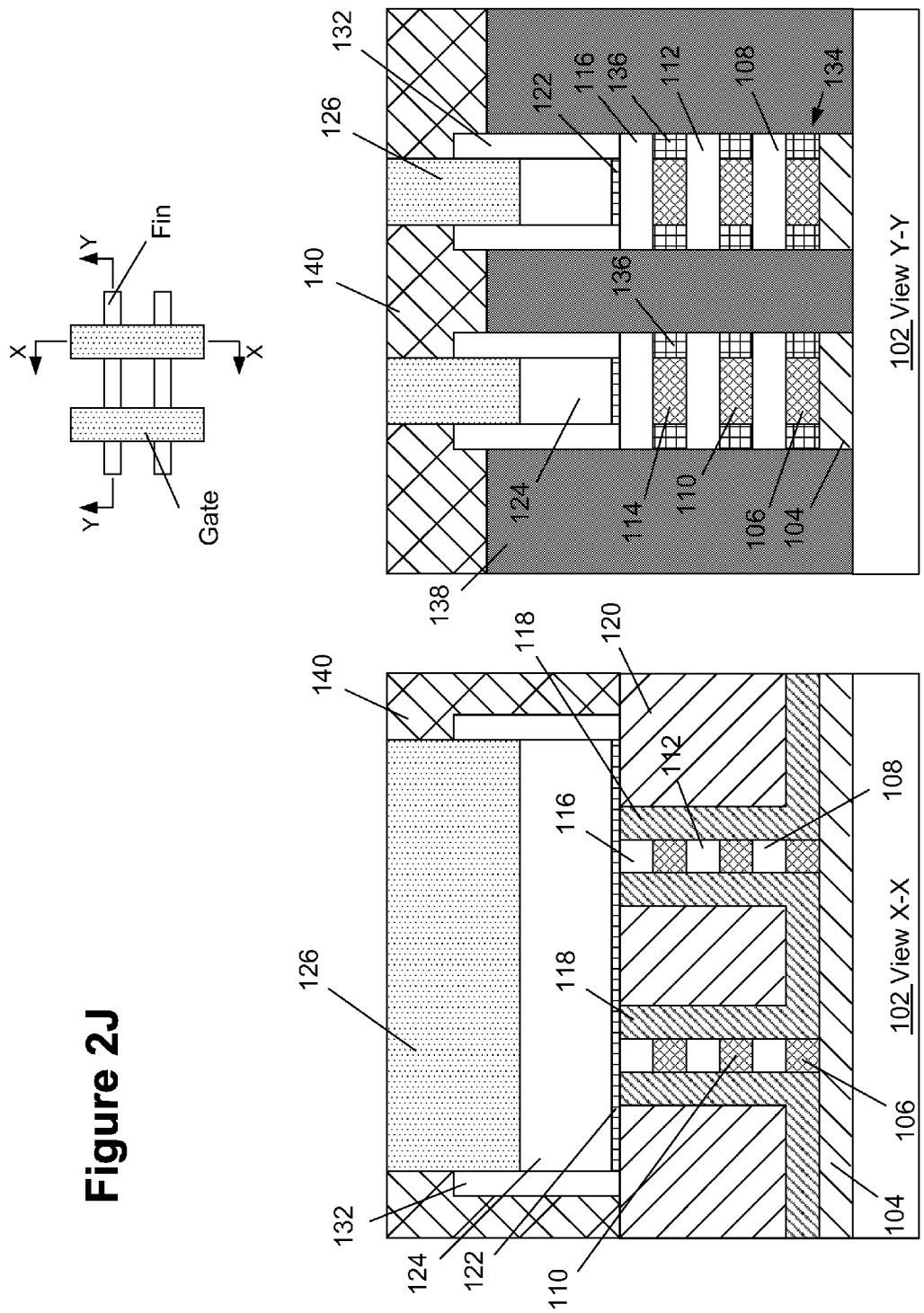

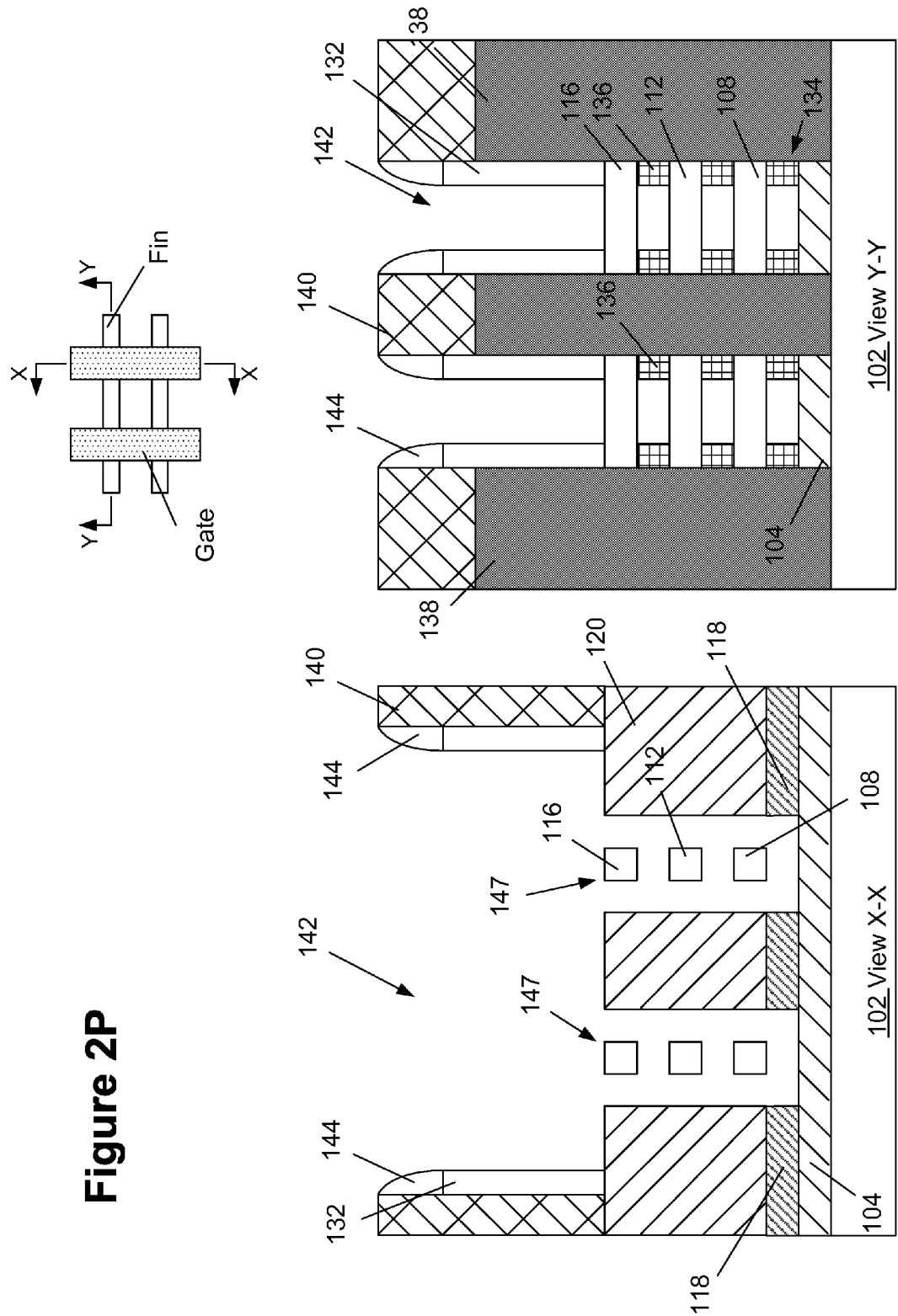

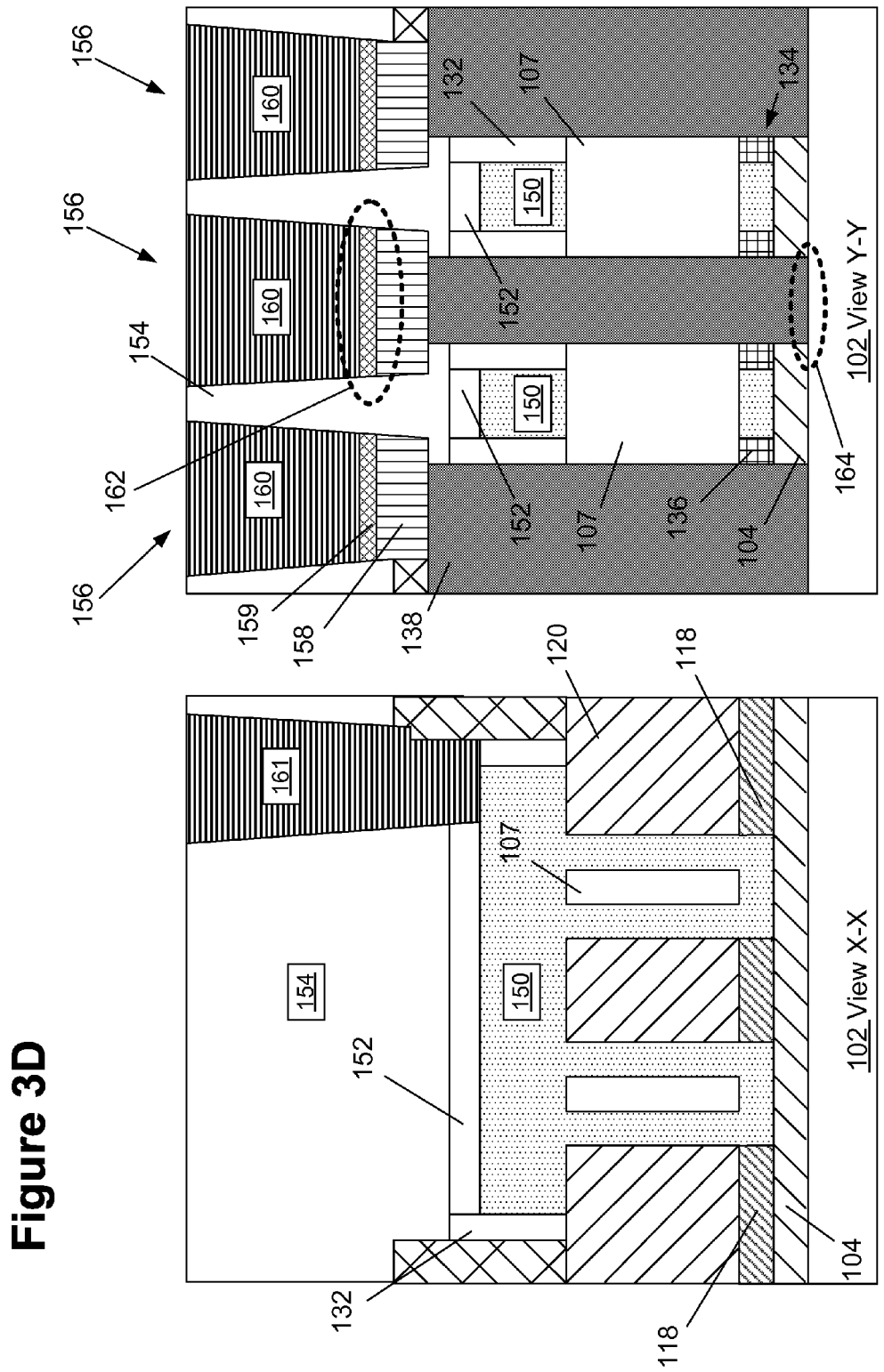

METHODS OF FORMING CONDUCTIVE CONTACT STRUCTURES FOR A SEMICONDUCTOR DEVICE WITH A LARGER METAL SILICIDE CONTACT AREA AND THE RESULTING DEVICES

BACKGROUND

1. Field of the Disclosure

The present disclosure generally relates to the formation of semiconductor devices and, more specifically, to various methods of forming conductive contact structures for a semiconductor device with a larger metal silicide contact area and the resulting devices.

2. Description of the Related Art

The fabrication of advanced integrated circuits, such as CPUs (central processing units), storage devices, ASICs (application specific integrated circuits) and the like, requires the formation of a large number of circuit elements in a given chip area according to a specified circuit layout, wherein so-called metal oxide semiconductor field effect transistors (MOSFETs or FETs) represent one important type of circuit element that substantially determines performance of the integrated circuits. A FET is a planar device that typically includes a source region, a drain region, a channel region that is positioned between the source region and the drain region, and a gate structure positioned above the channel region. These elements are sometimes referred to as the source, drain, channel and gate, respectively. Current flow through the FET is controlled by controlling the voltage applied to the gate electrode. For example, for an NMOS device, if there is no voltage applied to the gate electrode, then there is no current flow through the NMOS device (ignoring undesirable leakage currents, which are relatively small). However, when an appropriate positive voltage is applied to the gate electrode, the channel region of the NMOS device becomes conductive, and electrical current is permitted to flow between the source region and the drain region through the conductive channel region.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the source region and prevent the channel from being adversely affected by the electrical potential of the drain. This is sometimes referred to as a short channel effect, wherein the characteristic of the FET as an active switch is degraded.

In contrast to a FET, which has a planar structure, there are so-called 3D devices, such as an illustrative FinFET device, which is a three-dimensional structure. FIG. 1 is a perspective view of an illustrative prior art FinFET semiconductor device "A" that is formed above a semiconductor substrate B that will be referenced so as to explain, at a very high level, some basic features of a FinFET device. In this example, the FinFET device A includes three illustrative fins C, a gate structure D, sidewall spacers E and a gate cap layer F. Trenches T are formed in the substrate B to define the fins C. The gate structure D is typically comprised of a layer of gate insulating material (not separately shown), e.g., a layer of high-k insulating material (k-value of 10 or greater) or silicon dioxide, and one or more conductive material layers (e.g., metal and/or polysilicon) that serve as the gate electrode for the device A.

The fins C have a three-dimensional configuration: a height H, a width W and an axial length L. The axial length L corresponds to the direction of current travel in the device A when it is operational. The portions of the fins C covered by the gate structure D are the channel regions of the FinFET device A. The FinFET device may have either a tri-gate or a dual gate channel structure. In a FinFET device, a channel is formed perpendicular to a surface of the semiconducting substrate so as to reduce the physical size of the semiconductor device. Accordingly, for a given plot space (or foot-print), FinFETs tend to be able to generate significantly higher drive current density than planar transistor devices.

Another form of 3D semiconductor device employs so-called nanowire structures for the channel region of the device. There are several known techniques for forming such nanowire structures. As the name implies, at the completion of the fabrication process, the nanowire structures typically have a generally circular cross-sectional configuration. Nanowire devices are considered to be one option for solving the constant and continuous demand for semiconductor devices with smaller feature sizes. However, the manufacture of nanowire devices is a very complex process. However, it is believed that, for nanowire devices to be useful in producing production integrated circuit devices, such a nanowire device must include a plurality of stacked nanowires, e.g., three or more, such that the device can generate an acceptable level of drive current. Forming such tall, stacked nanowire structures can be very challenging for many reasons.

Irrespective of whether a planar or non-planar device is considered, electrical connections must be formed to the device so that it may operate as intended. That is, electrical connections must be made to the source region, the drain region and the gate electrode of the device. Typically, the conductive structures that actually make contact with the device itself, i.e., the source region, the drain region and the gate electrode, are referred to as "contacts" within the industry. Such conductive contacts are formed in one or more layers of insulating material. The entire arrangement of the conductive contacts and the associated layer(s) of insulating material are sometimes referred to as the "contact level" of the overall electrical "wiring arrangement" that is formed to provide electrical connection to the integrated circuit device.

Typically, due to the large number of circuit elements and the required complex layout of modern integrated circuits, the electrical connections of the individual circuit elements cannot be established within the same device level on which the circuit elements are manufactured, but require one or more additional metallization layers, which generally include metal-containing lines providing the intra-level electrical connection, and also include a plurality of inter-level connections or vertical connections, which are also referred to as vias. A modern integrated circuit product will typically comprise several metallization layers, e.g., multiple layers of conductive vias and conductive lines. The M1 metallization layer is typically the first major "wiring" layer that is formed on the product. As device dimensions have decreased, the conductive contact elements in the contact level have to be provided with critical dimensions in the same order of magnitude. The contact elements typically represent plugs, which are formed of an appropriate metal or metal composition, wherein, in sophisticated semiconductor devices, tungsten, in combination with appropriate barrier materials, has proven to be a viable contact metal. For this reason, contact technologies have been developed in which contact openings are formed in a self-aligned manner by removing dielectric material, such as silicon dioxide, selectively from the spaces between closely spaced gate electrode structures. That is, after completing the transistor structure, the gate electrode structures are used as etch masks for selectively removing the silicon dioxide material in order to expose the source/drain regions of the transistors, thereby providing self-aligned trenches which are substantially laterally delineated by the spacer structures of the gate electrode structures.

Notwithstanding the complex processing described above, device dimensions continue to decrease and packing densities continue to increase. For gate pitch scaling less than, for example, 50 nm, there is simply not enough space for the formation of the gate contact, the source contact and the drain contact using existing methodologies and traditional devices, e.g., planar devices. Thus, nanowire devices present a potentially attractive alternative to obtained the desired control of the gate (so as to avoid or at least reduce undesirable short channel effects) and to reduce the gate length of the transistor device, so as to thereby leave more room for the formation of the various source, drain and gate contacts. However, even with such scaled nanowire devices, the source/drain regions are very small in terms of area. Typically, an epi semiconductor material will be formed in the source/drain regions of the device and, thereafter, a metal silicide region will be formed on the epi material so as to reduce the contact resistance when forming a conductive contact to the source/drain region. Given the very small contact area available in the source/drain region, the resulting metal silicide region also has a corresponding small contract area, which means an undesirable increase in the contact resistance. Such an increase in contact resistance can result in the degradation of the performance of the device.

The present disclosure is directed to various methods of forming conductive contact structures for a semiconductor device with a larger metal silicide contact area and the resulting devices that may reduce or eliminate one or more of the problems identified above.

SUMMARY

The following presents a simplified summary of the disclosure in order to provide a basic understanding of some aspects of the disclosure. This summary is not an exhaustive overview. Its sole purpose is to present some concepts in a simplified form as a prelude to the more detailed description that is discussed later.

Generally, the present disclosure is directed to various methods of forming conductive contact structures for a semiconductor device with a larger metal silicide contact area and the resulting devices. One illustrative method disclosed herein includes, among other things, forming a first epi semiconductor material in a source/drain region of a transistor device, the first epi semiconductor material having a first lateral width at an upper surface thereof, forming a second epi semiconductor material on the first epi semiconductor material and above at least a portion of one of a gate cap layer or one of the sidewall spacers of the device, wherein the second epi semiconductor material has a second lateral width at an upper surface thereof that is greater than the first lateral width, and forming a metal silicide region on the upper surface of the second epi semiconductor material.

Another illustrative method disclosed herein includes, among other things, forming a sacrificial gate structure above a semiconductor material, forming a sidewall spacer adjacent opposite sides of the gate structure, forming a first epi semiconductor material in a source/drain region of the transistor, after forming the first epi semiconductor material, removing the sacrificial gate structure to define a replacement gate cavity defined by the sidewall spacers, forming a replacement gate structure and a gate cap layer within the replacement gate cavity, performing at least one recess etching process to reduce a thickness of the gate cap layer and a height of the sidewall spacers, forming a layer of insulating material above the recessed gate cap layer, the recessed sidewall spacers and the first epi semiconductor material, forming a contact opening in at least the layer of insulating material so as to expose an upper surface of the first epi semiconductor material, forming a second epi semiconductor material on the first epi semiconductor material and above at least a portion of one of the recessed gate cap layer or one of the recessed sidewall spacers, and forming a metal silicide region on the exposed upper surface of the second epi semiconductor material within the contact opening.

An illustrative device disclosed herein includes, among other things, a gate structure, a gate cap layer positioned above the gate structure, a sidewall spacer positioned adjacent opposite sides of the gate structure, a first epi semiconductor material positioned in a source/drain region of the device, the first epi semiconductor material having a first lateral width at an upper surface thereof, a second epi semiconductor material positioned on the first epi semiconductor material and above at least a portion of one of the gate cap layer or one of the sidewall spacers of the device, wherein the second epi semiconductor material has a second lateral width at an upper surface thereof that is greater than the first lateral width, and a metal silicide region positioned on the upper surface of the second epi semiconductor material.

Another illustrative method is disclosed herein for forming a nanowire device. The method includes, among other things, performing an etching process through a replacement gate cavity to form first and second stacked laterally spaced-apart nanowire structures, each of which is comprised of a plurality of vertically spaced-apart nanowires, forming a gate insulation layer within the replacement gate cavity such that it forms around each of the vertically spaced-apart nanowires of the first and second plurality of stacked nanowire structures, forming at least one work function adjusting metal layer within the replacement gate cavity such that it forms around each of the vertically spaced-apart nanowires of the first and second plurality of stacked nanowire structures and above an upper surface of a layer of insulating material positioned between the laterally spaced-apart first and second plurality of stacked nanowire structures, wherein the work function adjusting metal layer has an upper surface that is positioned above the upper surface of the layer of insulating material and above the uppermost nanowire in each of the first and second plurality of stacked nanowire structures, forming at least one conductive material within the replacement gate cavity above the upper surface of the work function adjusting metal layer within the replacement gate cavity, and forming a gate cap layer within the replacement gate cavity above the at least one conductive material.

BRIEF DESCRIPTION OF THE DRAWINGS

The disclosure may be understood by reference to the following description taken in conjunction with the accompanying drawings, in which like reference numerals identify like elements, and in which:

FIGS. 3A-3D depict yet other illustrative novel methods disclosed herein of forming conductive contact structures for a semiconductor device with a larger metal silicide contact area.

Figure 1:
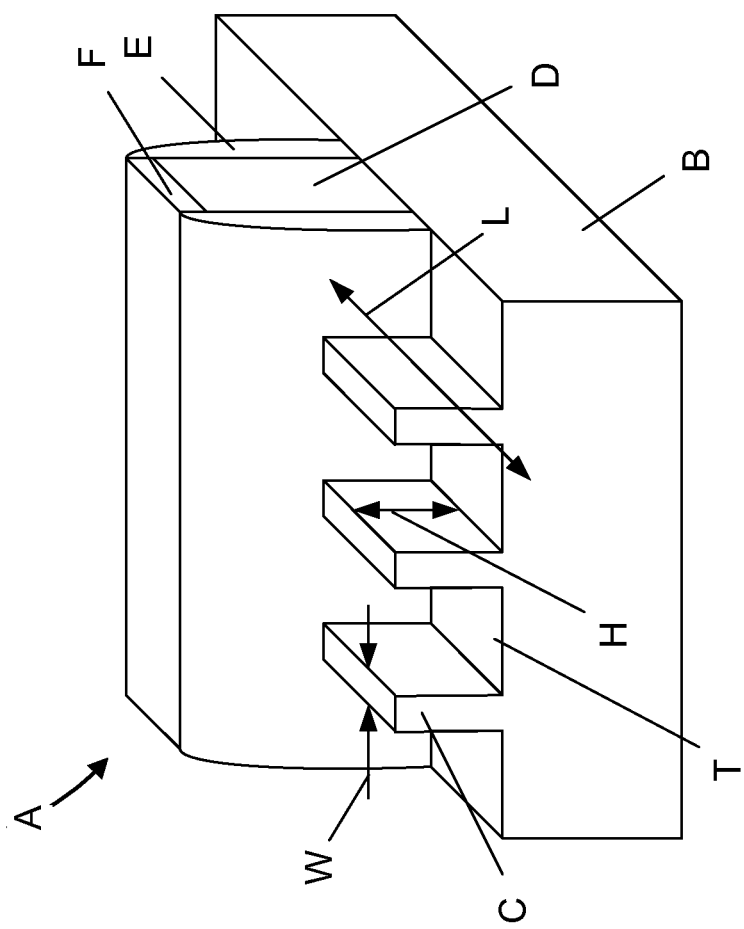
FIG. 1 depicts a cross-sectional view of an illustrative prior art 3D device.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the disclosure to the particular forms disclosed, but on the contrary, the intention is to cover all modifications, equivalents, and alternatives falling within the spirit and scope of the disclosure as defined by the appended claims.

NOTATION AND NOMENCLATURE

Certain terms are used throughout the disclosure to refer to particular components. However, different entities may refer to a component by different names. This document does not intend to distinguish between components that differ in name but not function. The terms "including" and "comprising" are used herein in open-ended fashion, and thus mean "including, but not limited to."

DETAILED DESCRIPTION

The present subject matter will now be described with reference to the attached figures. Various structures, systems, and devices are schematically depicted in the drawings for purposes of explanation only. The attached drawings are included to describe and explain illustrative examples of the present disclosure. The words and phrases used herein should be understood and interpreted to have a meaning consistent with the understanding of those words and phrases by those in the industry. No special definition of a term or phrase, i.e., a definition that is different from the ordinary and customary meaning as understood by those in the industry, is intended to be implied by consistent usage of the term or phrase herein. To the extent that a term or phrase is intended to have a special meaning, such a special definition will be expressly set forth in the specification in a definitional manner that directly and unequivocally provides the special definition for the term or phrase.

The present disclosure is directed to various methods of forming conductive contact structures for a semiconductor device with a larger metal silicide contact area and the resulting devices. As shown more fully below, an illustrative nanowire device, which, in the depicted example, is a gate-all-around (GAA) FinFET device, may be formed using the methods disclosed herein. As will be readily apparent, the present method is applicable to a variety of devices, including, but not limited to, logic devices, memory devices, etc., and the methods disclosed herein may be employed to form N-type or P-type semiconductor devices. Additionally, various doped regions, e.g., source/drain regions, halo implant regions, well regions and the like, are not depicted in the attached drawings. Of course, the inventions disclosed herein should not be considered to be limited to the illustrative examples depicted and described herein. The various components and structures of the device 100 disclosed herein may be formed using a variety of different materials and by performing a variety of known techniques, e.g., a chemical vapor deposition (CVD) process, an atomic layer deposition (ALD) process, a thermal growth process, spin-coating techniques, etc. The thicknesses of these various layers of material may also vary depending upon the particular application. With reference to the attached figures, various illustrative embodiments of the methods and devices disclosed herein will now be described in more detail.

In the depicted examples, the device will be disclosed in the context of forming a gate-all-around (GAA) FinFET device. However, the present disclosure should not be considered to be limited to the examples depicted herein. The substrate 102 may include a variety of configurations, such as a bulk silicon configuration, an SOI configuration or a SiGeOI configuration. Thus, the terms "substrate" or "semiconducting substrate" should be understood to cover all substrate configurations. The substrate 102 may also be made of materials other than silicon.

Figure 2A:
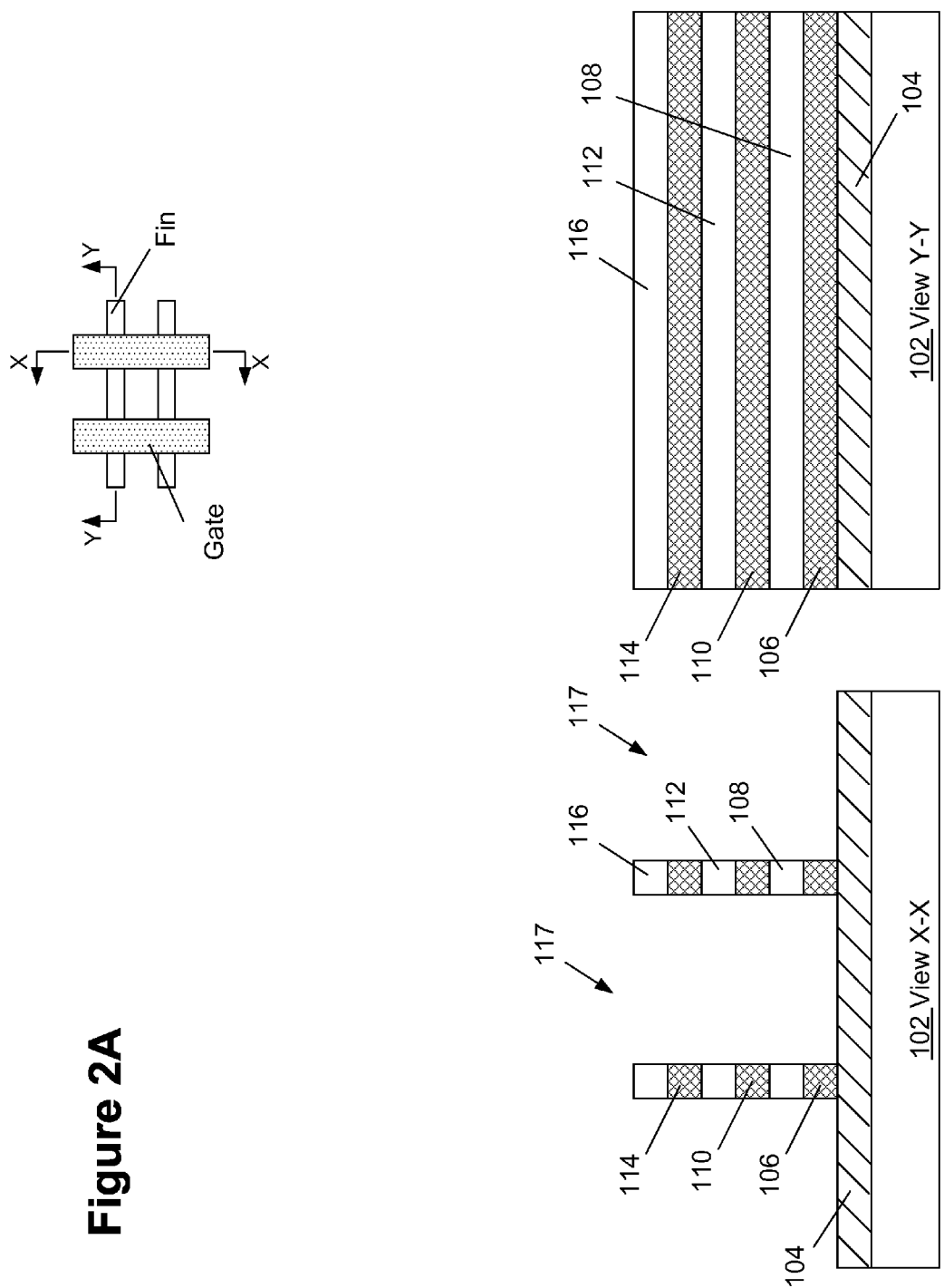
FIGS. 2A-2X depict various novel methods disclosed herein of forming conductive contact structures for a semiconductor device with a larger metal silicide contact area.

As shown in a simplistic plan drawing shown in the upper right corner of FIG. 2A, the view "X-X" is a cross-sectional view taken through a gate structure (in a direction transverse to the current transport direction of the device, that is, the gate width direction, i.e., the gate width direction), while the "Y-Y" is a cross-sectional view taken along the long axis of an illustrative fin, i.e., a cross-sectional view along the long axis of the fin in the current transport direction of the device.

FIG. 2A depicts a device or product after several process operations were performed. First, the device comprises various layers of semiconducting material 106, 108, 110, 112, 114 and 116 that are positioned above the illustrative SiGeOI substrate 102. In general, in the depicted example, the layers 106, 110 and 114 are made of a semiconductor material that may be selectively removed or etched relative to the materials used for the semiconducting material layers 108, 112 and 116. The number of such layers may vary depending upon the application. As described more fully below, in the channel region of the device, portions of the semiconductor material layers 106, 110 and 114 will be removed while portions of the semiconducting material layers 108, 112 and 116 are left in place so as to form nanowire structures for the channel region. Thus, the portions of the semiconducting material layers 106, 110 and 114 within the channel region of the device are sacrificial in nature. The semiconductor materials 106, 108, 110, 112, 114 and 116 may include a variety of different materials such as, for example, silicon, doped silicon, silicon/germanium, a III-V material, germanium, etc., and they may be formed to any desired thickness using any appropriate process, e.g., an epitaxial growth process, deposition plus ion implantation, etc. In one embodiment, the layers 106, 110 and 114 are made of silicon/germanium, while the semiconducting material layers 108, 112 and 116 are made of silicon. The thickness of the layers 106, 108, 110, 112, 114 and 116 may vary depending upon the application, and they may be formed to the same or different thicknesses. In one illustrative embodiment, the substrate is an SiGeOI substrate wherein the layer 106 is the active layer of the substrate, the layer 104 is the buried insulation layer, e.g., silicon dioxide, of the substrate and the bulk substrate layer 102 is made of silicon, as the substrate is supplied by the substrate manufacturer. In that example, the layers 108, 110, 112, 114 and 116 may be sequentially deposited above the active layer, i.e., the layer 106, of the SiGeOI substrate. FIG. 2A (view X-X) depicts the device after one or more etching processes were performed though a patterned masking layer (not shown), such as a patterned photoresist mask, to pattern the various layers of material 106, 108, 110, 112, 114 and 116. These process operations results in the formation of a plurality of trenches 117. In the depicted example, this etching process stops on the buried insulation layer 104 of the illustrative SiGeOI substrate.

Figure 2B:
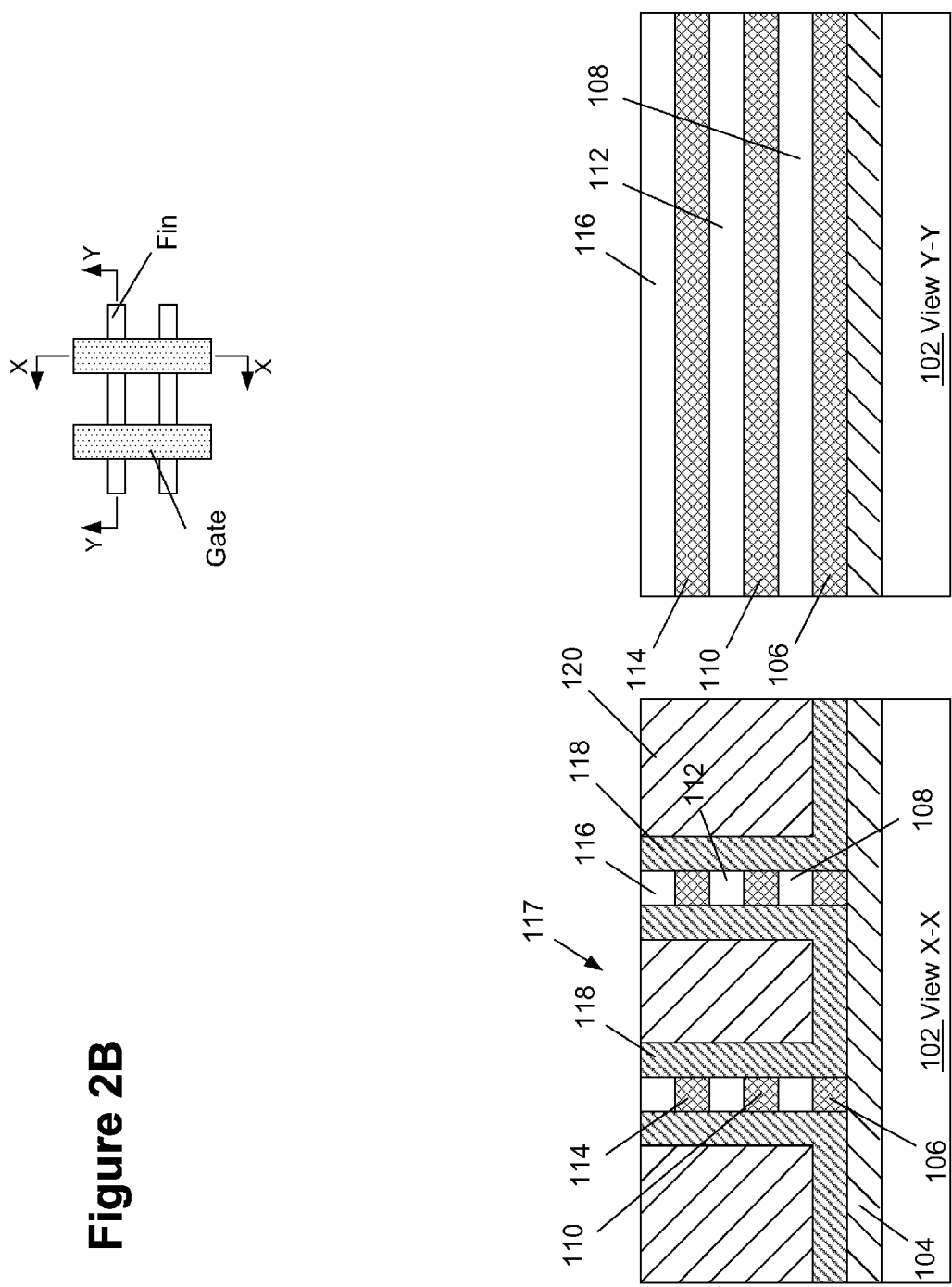

FIG. 2B also depicts the device after several process operations were performed. First, a liner layer 118, e.g., silicon nitride, was formed above the device by performing a conformable deposition process. Thereafter, a layer of insulating material 120, e.g., silicon dioxide, was formed on the device so as to overfill the trenches 117. Next, one or more CMP processes were performed that stops on the semiconductor material layer 116 so as to arrive at the structure depicted in FIG. 2B. The liner layer 118 may be formed by performing a conformal deposition process, e.g., CVD, ALD. The liner layer 118 may be formed to any thickness which is similar to the thickness of the high-k/work-function metal stack, e.g., 7-10 nm. The layer of insulating material 120 may be comprised of a variety of different materials, such as silicon dioxide, etc., and it may be formed by performing a variety of techniques, e.g., CVD, etc. The thickness of the layer of insulating material 120 may vary depending upon the particular application.

Figure 2C:
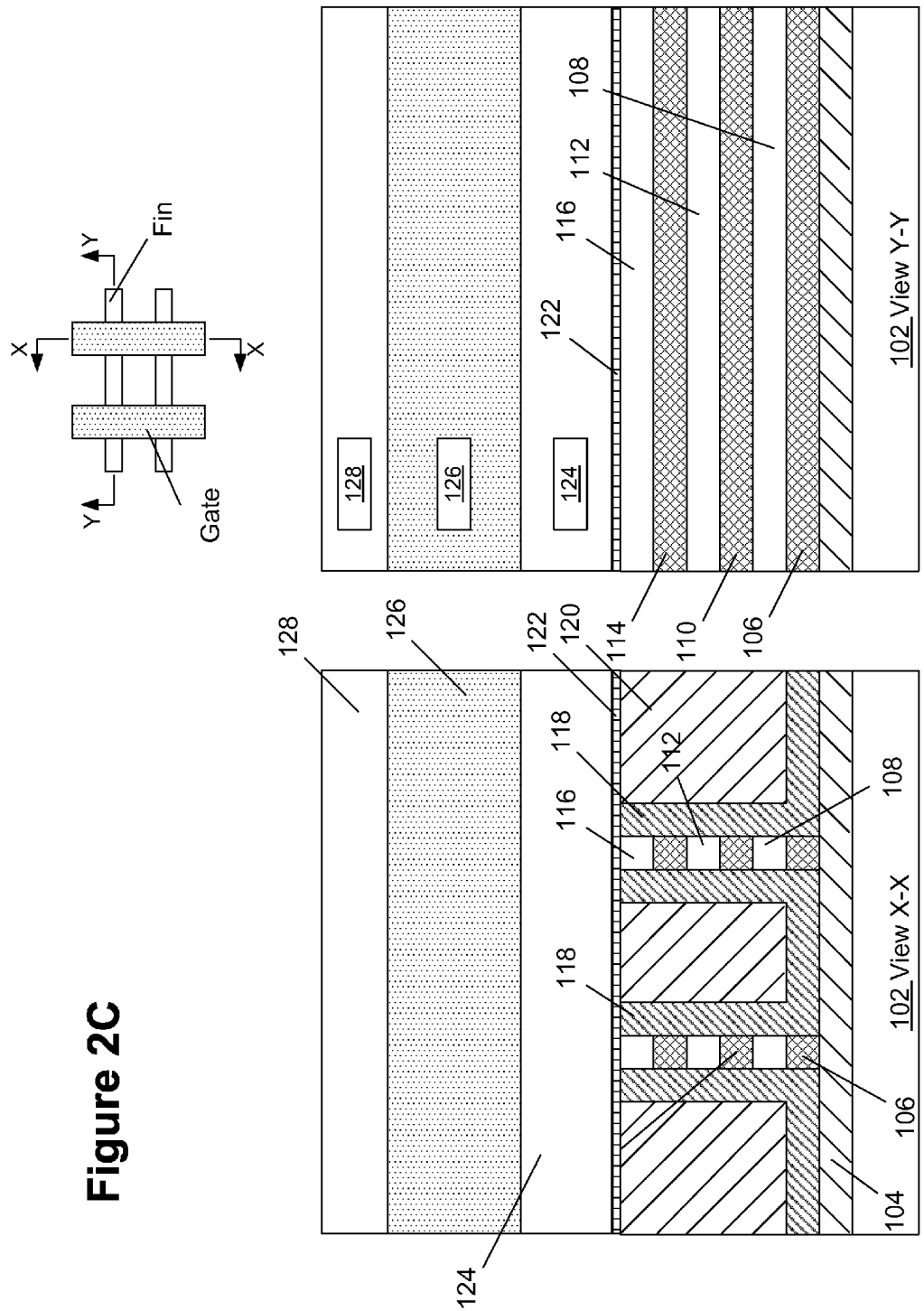

FIG. 2C depicts the device at a point in fabrication wherein the materials of construction for a sacrificial gate structure were formed above the device. More specifically, in one embodiment, the layers include a sacrificial gate insulation layer 122, e. g., a layer of silicon dioxide, a sacrificial gate electrode layer 124, e.g., polysilicon or amorphous silicon, a first gate cap layer 126, e.g., silicon nitride and a second gate cap layer 128, e.g., a layer of silicon dioxide. The layers of material 122, 124, 126 and 128 may be formed to any desired thickness and they may be formed by performing a variety of known processes.

FIG. 2D depicts the device after one or more etching processes were performed through a patterned etch mask, e.g., a patterned layer of photoresist material (not shown) to result in the patterned sacrificial gate structures 130 (see view Y-Y). The sacrificial gate structures 130, i.e., the sacrificial gate insulation layer 122 and the sacrificial gate electrode 124, are intended to be representative in nature of any type of gate structure that may be employed in manufacturing integrated circuit products using so-called gate-last (replacement gate) manufacturing techniques. Of course, as described more fully below, the present inventions are not limited to devices wherein the gate structures are formed using only replacement gate techniques. The illustrative dual-layer gate cap, e.g., the layers 126 and 128, are positioned above each of the sacrificial gate structures 130. The sacrificial gate structures 130 remain in place as many process operations are performed to form the device, e.g., the formation of the raised, doped source/drain regions, performing an anneal process to activate implanted dopant materials, etc. As will be appreciated by those skilled in the art after a complete reading of the present application, using the methods disclosed herein, the patterning of the gate stack is much easier as compared to prior art techniques. That is, in prior art processing techniques, to achieve a stacked nanowire structure, such as three stacked nanowires, very tall fins were required. Such tall fins made the patterning of the gate structure between adjacent tall fins very difficult. In contrast, by virtue of forming the layer of insulating material 120 and other structures, the gate patterning process stops on a planar surface and not within the limited space between adjacent fins.

Figure 2E:
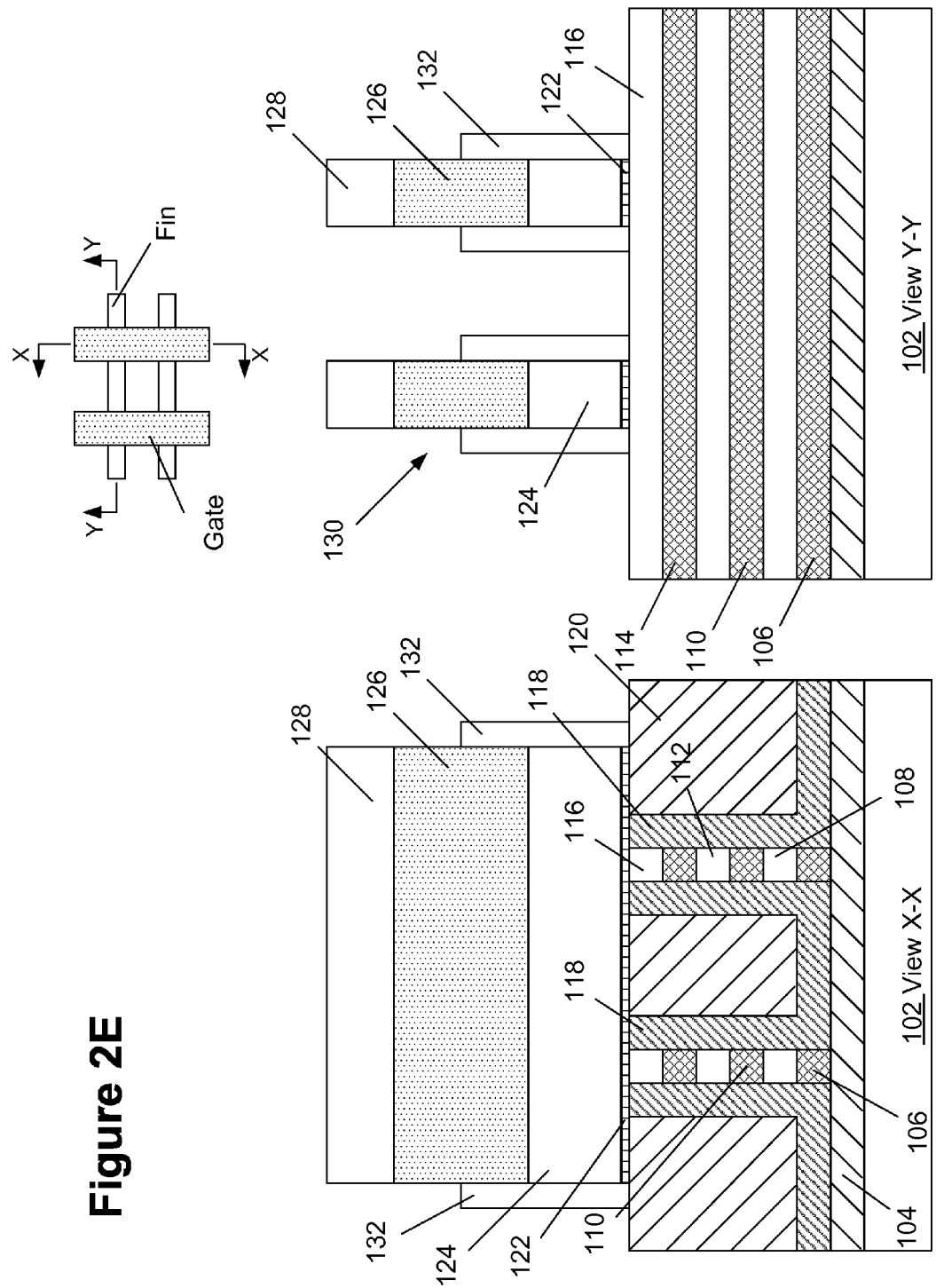

FIG. 2E depicts the device after illustrative sidewall spacers 132 were formed adjacent the sacrificial gate structures 130 on opposing sidewalls of the gate structure 130. The sidewall spacers 132 may be formed by depositing a layer of spacer material, such as silicon nitride, and thereafter performing an anisotropic etching process to define the spacers 132. In the depicted example, the etching process that is performed to form the spacers 132 is performed for a sufficient duration to "pull-down" the height of the spacers 132, i.e., to reduce the height of the spacers 132. This is done to insure that the spacers 132 that are formed on the exposed portions of the material layers 106, 108, 110, 112, 114 and 116 in the source/drain regions of the device are cleared of the spacer material.

Figure 2F:
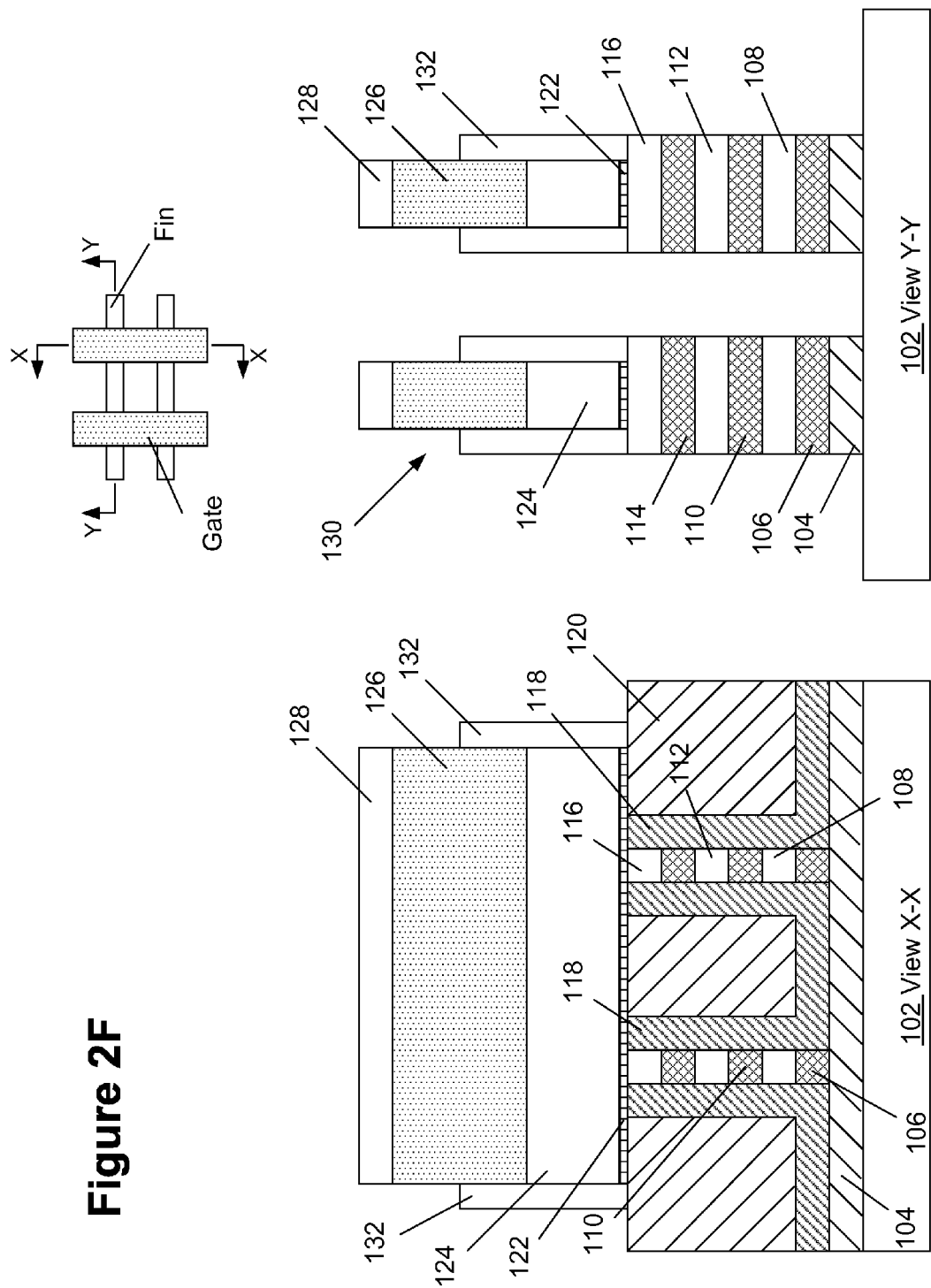

FIG. 2F depicts the product after one or more anisotropic etching processes were performed to remove the exposed portions of the material layers 104, 106, 108, 110, 112, 114 and 116 that were not covered by the gate structures 130 and the spacers 132. In the depicted example, the etching processes stop on the bulk substrate 102.

Figure 2G:
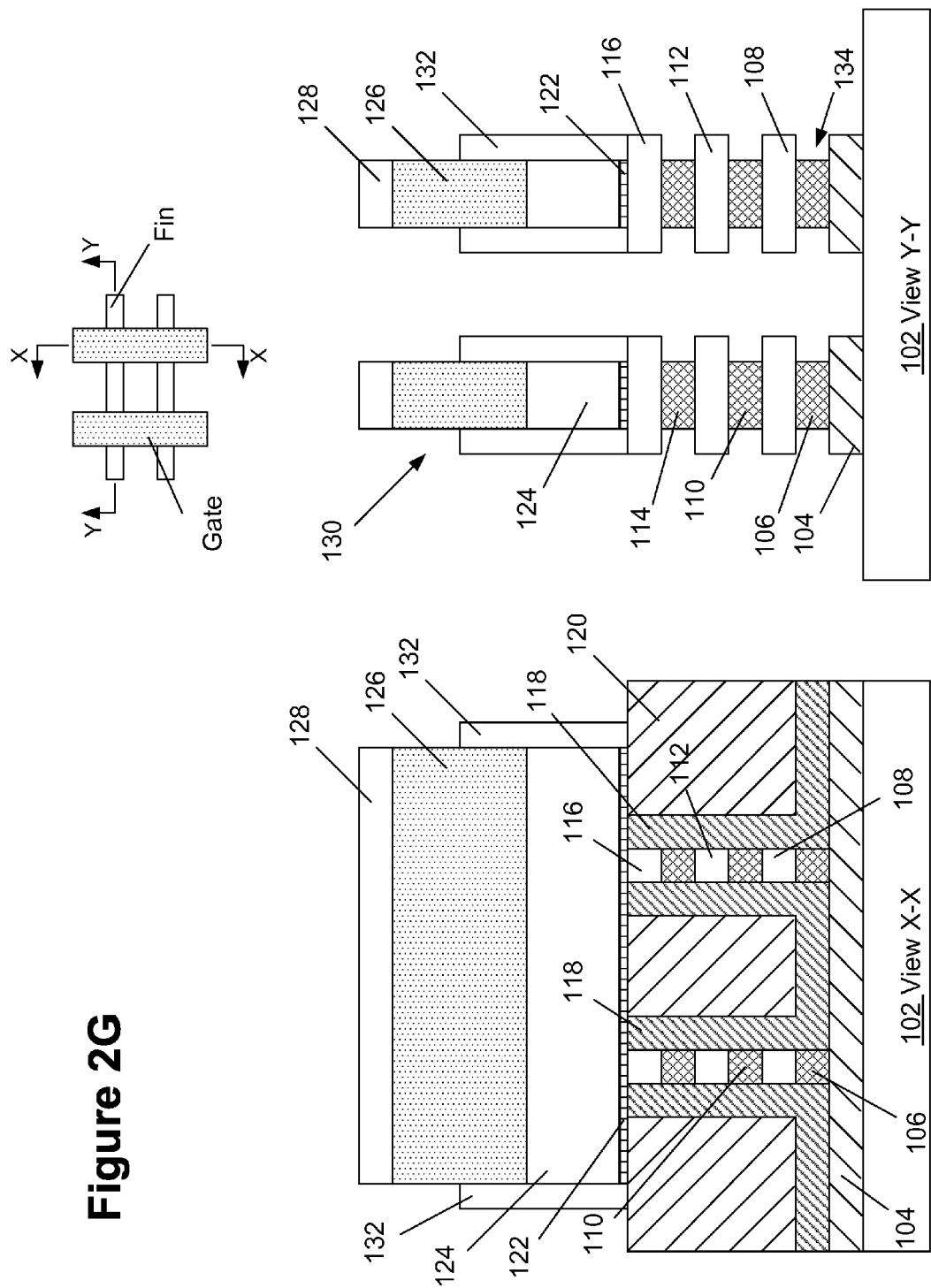

FIG. 2G depicts the product after a recess etching process, e.g., an isotropic etching process, was performed to remove portions of the material layers 106, 110 and 114 selectively relative to the surrounding structures and material. This results in the formation of recesses 134. This results in the layers 106, 110 and 114 having a shorter length (in the current transport direction) than the layers 108, 112 and 116. In at least one embodiment, the layers 106, 110 and 114 are recessed such that the ends of the recessed layers are approximately aligned with the interface between the sidewall spacers 132 and the gate electrode 124 as viewed in cross-section.

Figure 2H:
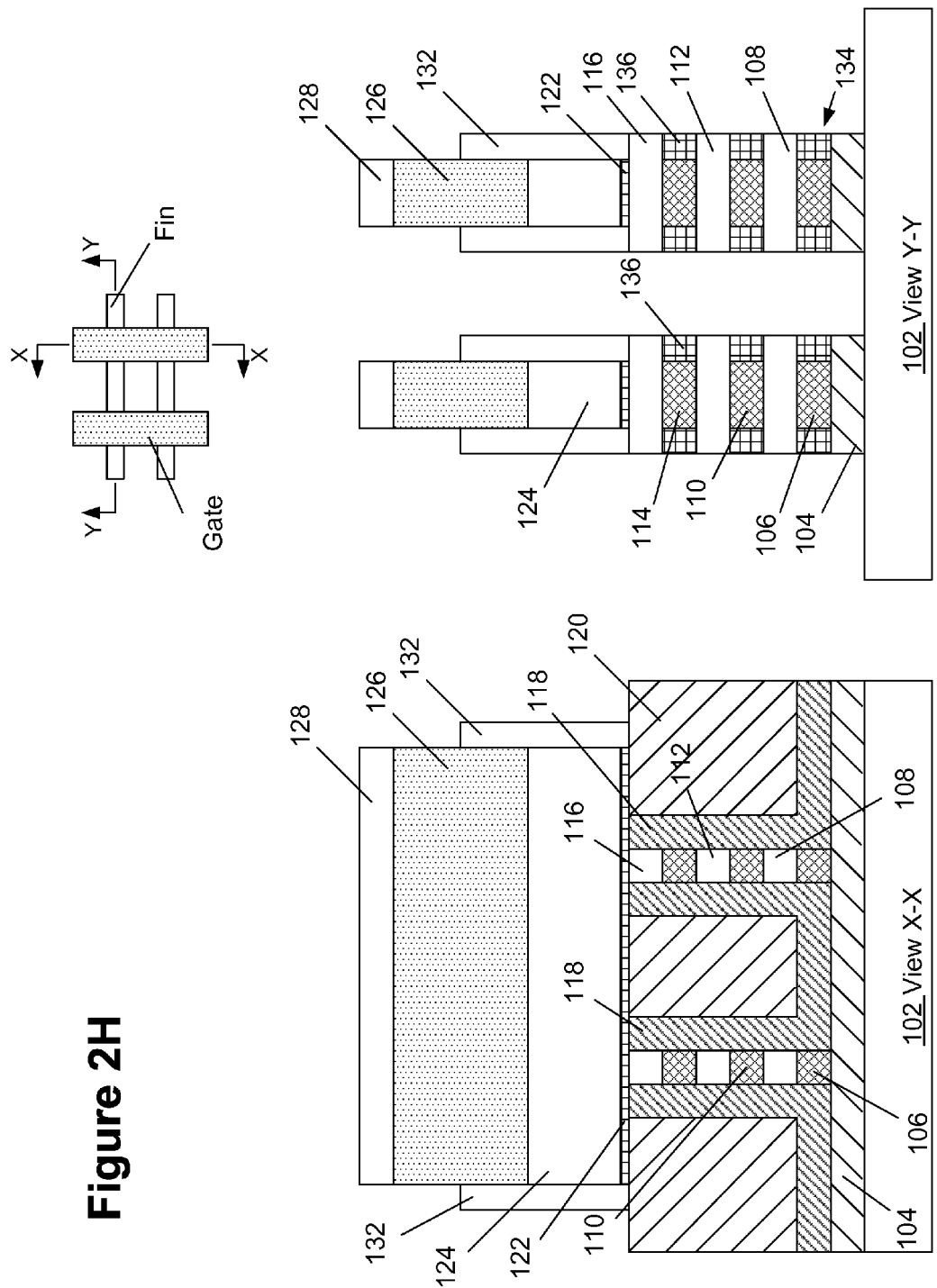

FIG. 2H depicts the product after several process operations were performed. First, a conformal deposition process, such as a conformal ALD or CVD process, was formed so as to fill the recesses 134. Thereafter, an etching process was performed so as to remove excess material positioned outside of the recesses 134. This results in the formation of the material regions 136 in the recesses 134. In one embodiment, the material regions 136 may be made of silicon nitride.

Figure 2I:
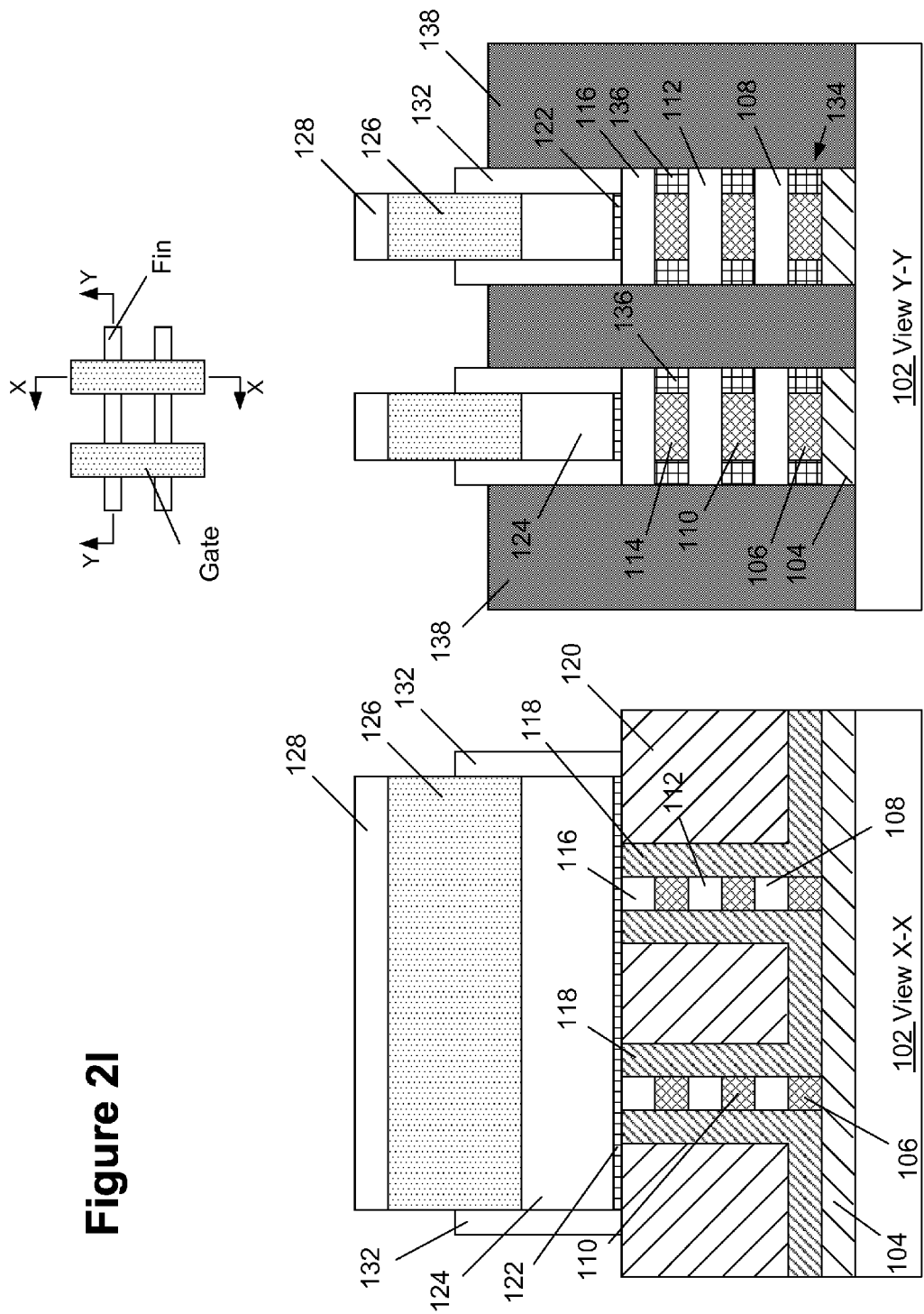

FIG. 2I depicts the product after a first portion of the raised epitaxial (epi) source/drain regions 138 were formed on the product by performing known epitaxial growth processes. As depicted, the epi source/drain regions 138 will engage the semiconductor material layers 108, 112 and 116. The material regions 136 prevent the epi source/drain regions 138 from engaging the material layers 106, 110 and 114. The first epi source/drain material 138 may be formed to any desired thickness (or height) above the surface of the bulk substrate 102. The epi source/drain regions 138 may be doped (with an N- or P-type dopant material) in situ or they may be doped at a later time by performing one or more ion implantation processes. In the depicted example, given the number of layers (106, 108, 110, 112, 114 and 116) formed above the substrate, the epi source/drain regions 138 may have a thickness (or height) that falls within the range of about 80-200 nm. Of course, after a complete reading of the present application, those skilled in the art will appreciate that the methods and devices disclosed herein may involve formation of more or fewer layers of semiconductor material than the six illustrative layers (106, 108, 110, 112, 114 and 116) depicted herein, and that the epi source/drain regions 138 may be formed to any desired thickness.

FIG. 2J depicts the product after several process operations were performed. First, a layer of insulating material 140 was deposited across the product. Thereafter, a CMP process was performed to remove the excess portions of the layer of insulating material 140 using the gate cap layer 126 as a polish-stop. The layer of insulating material 140 may be comprised of a variety of different materials, such as silicon dioxide, etc., and it may be formed by performing a variety of techniques, e.g., CVD, etc. The thickness of the layer of insulating material 140 may vary depending upon the particular application.

Figure 2K:
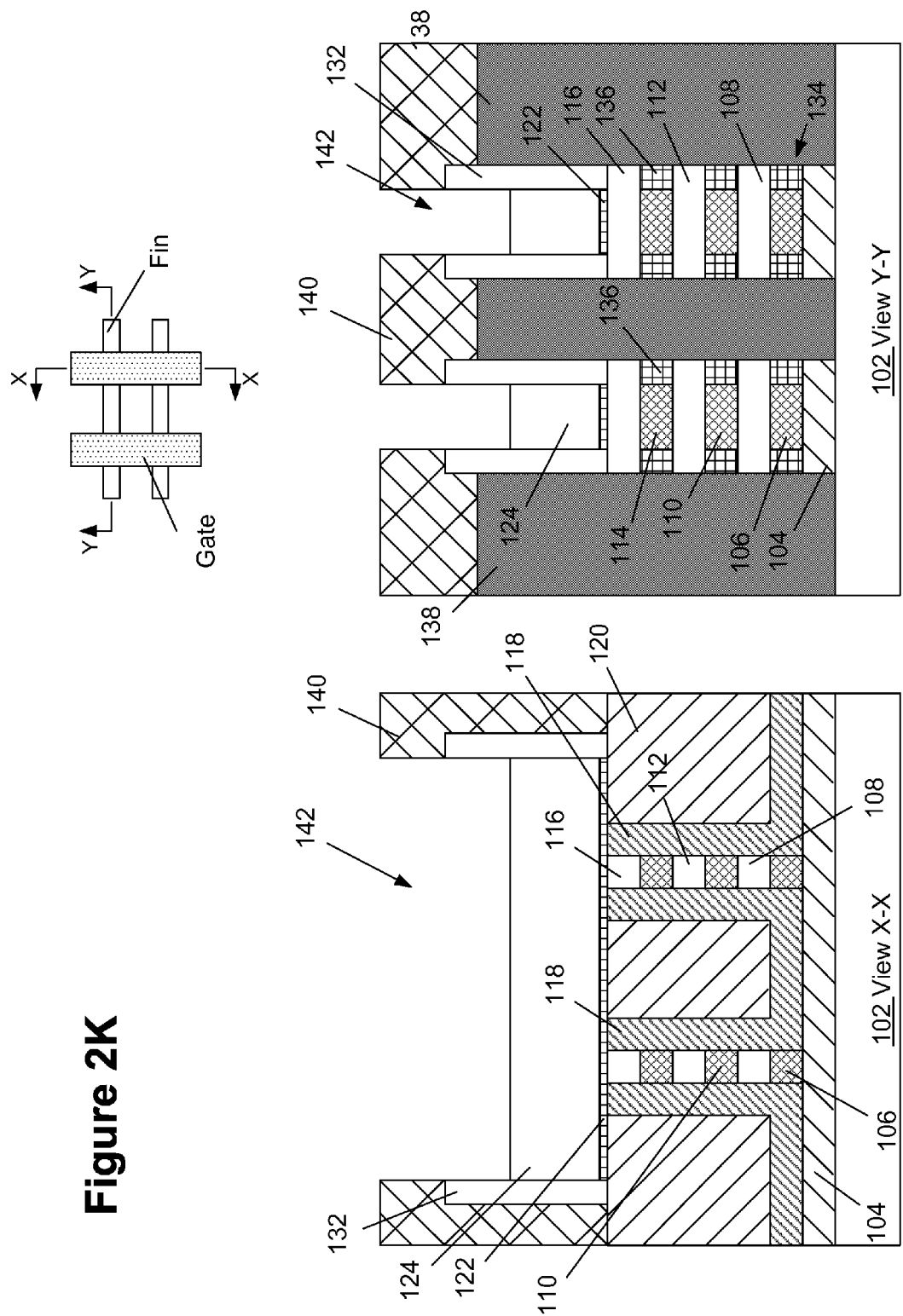

FIG. 2K depicts the device after an etching process, such as an anisotropic etching process, was performed to remove the exposed gate cap layer 126 selectively relative to the surrounding materials. This process operation results in the definition of a cavity 142 above the sacrificial gate electrode 124 and exposes the sacrificial gate electrode 124 for removal.

Figure 2L:
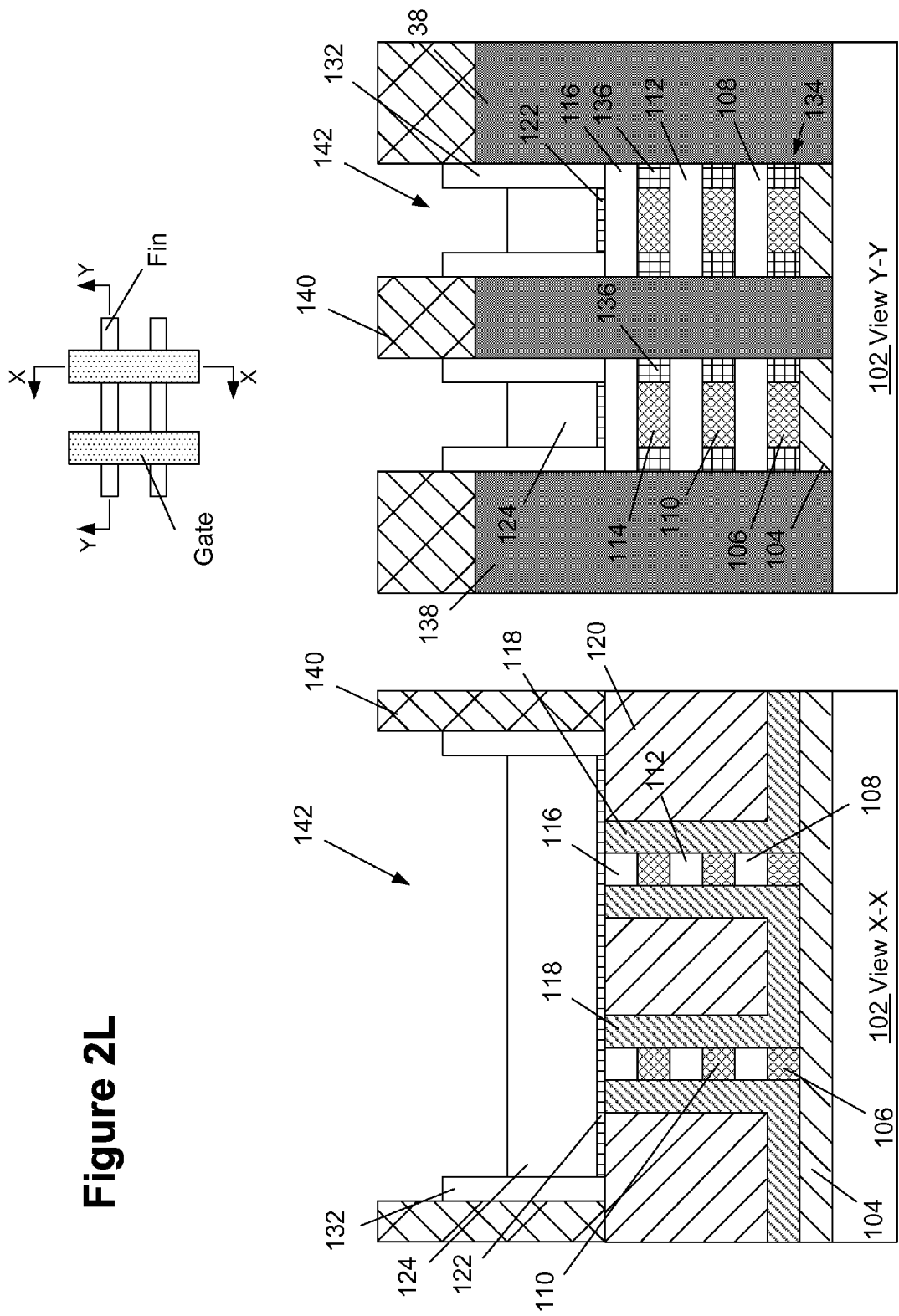

FIG. 2L depicts the device after an etching process, such as an isotropic etching process, was performed to remove portions of the layer of insulating material 140 and thereby increase the lateral width of the cavity 142 above the sacrificial gate electrode 124. This process also exposes the upper surface of the sidewall spacers 132.

Figure 2M:
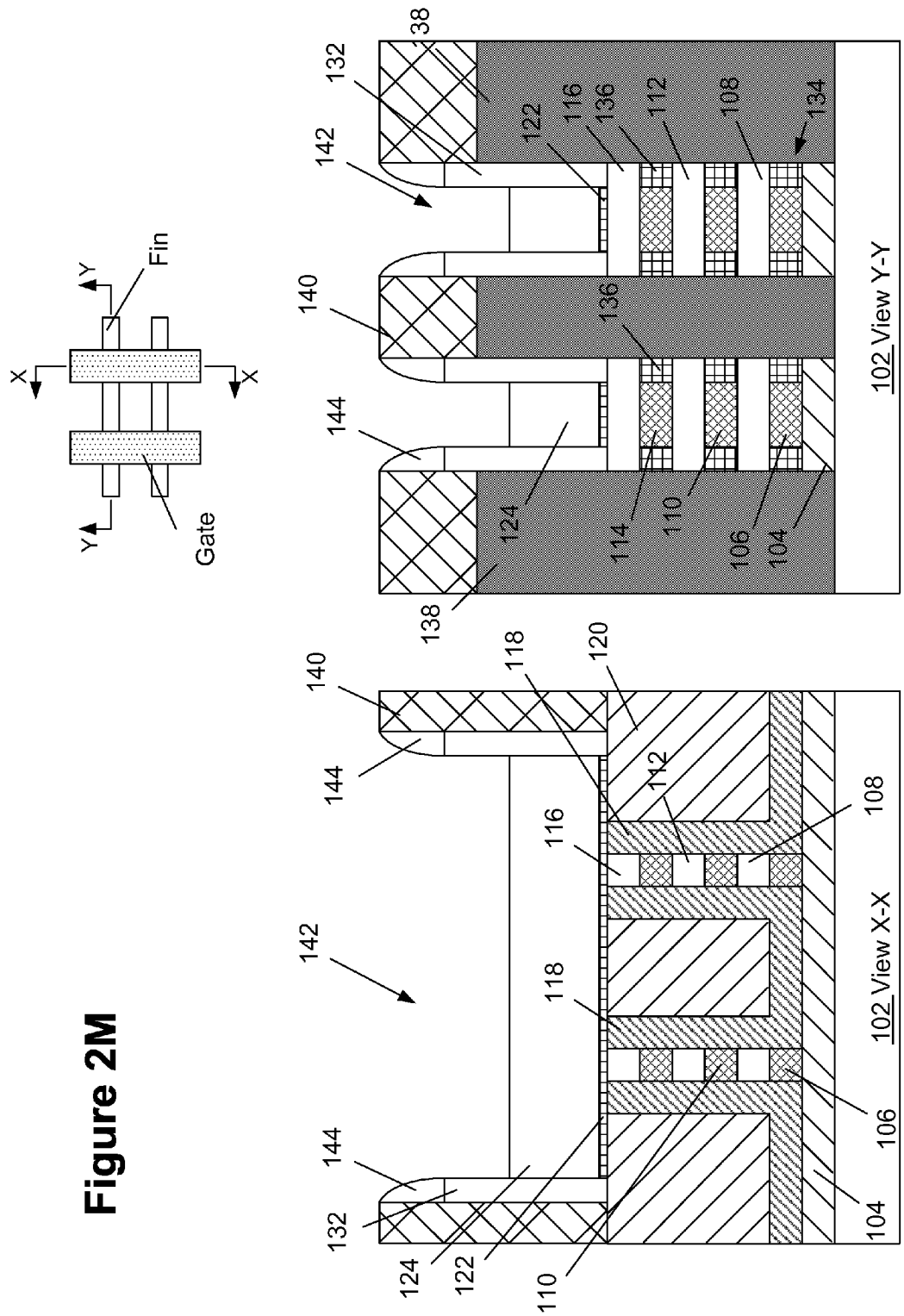

FIG. 2M depicts the device after illustrative protective sidewall spacers 144 were formed above the sidewall spacers 132. The sidewall spacers 144 may be formed by depositing a layer of spacer material, such as a high-k (k value greater than 10) dielectric material (e.g., hafnium oxide, aluminum oxide), and thereafter performing an anisotropic etching process to define the spacers 144. The spacers 144 are formed to protect the spacers 132 during subsequent process operations.

Figure 2N:
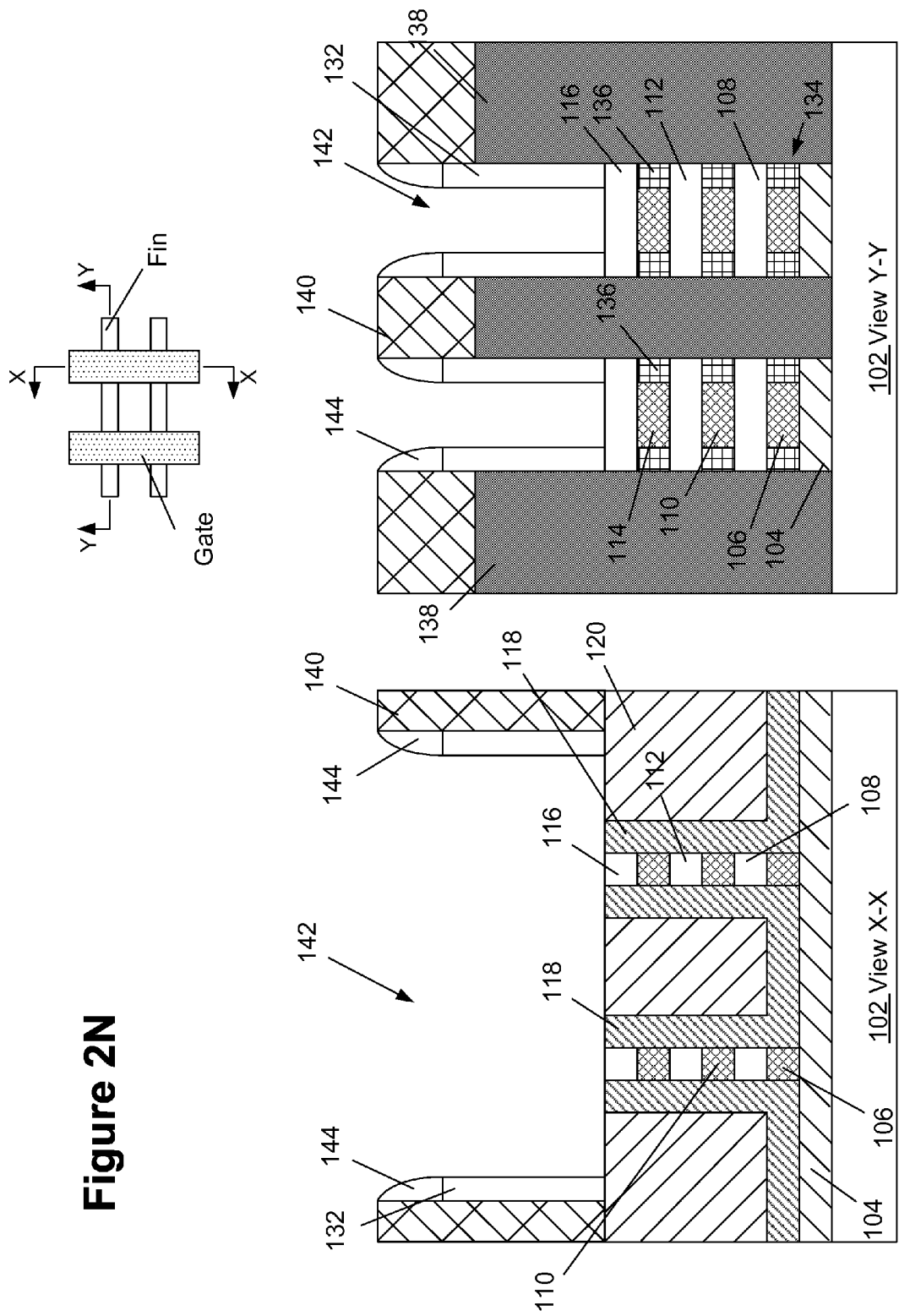

FIG. 2N depicts the product after one or more etching processes were performed to remove the sacrificial gate structure 130 (i.e., the sacrificial gate electrode 124 and the sacrificial gate insulation layer 122) and thereby define a replacement gate cavity 142. The removal of the sacrificial gate structure 130 exposes the upper surfaces of the layer 120, the liner 118 and the uppermost surface of the fin structure within the gate cavity 142, i.e., the upper surface of the material layer 116.

Figure 2O:
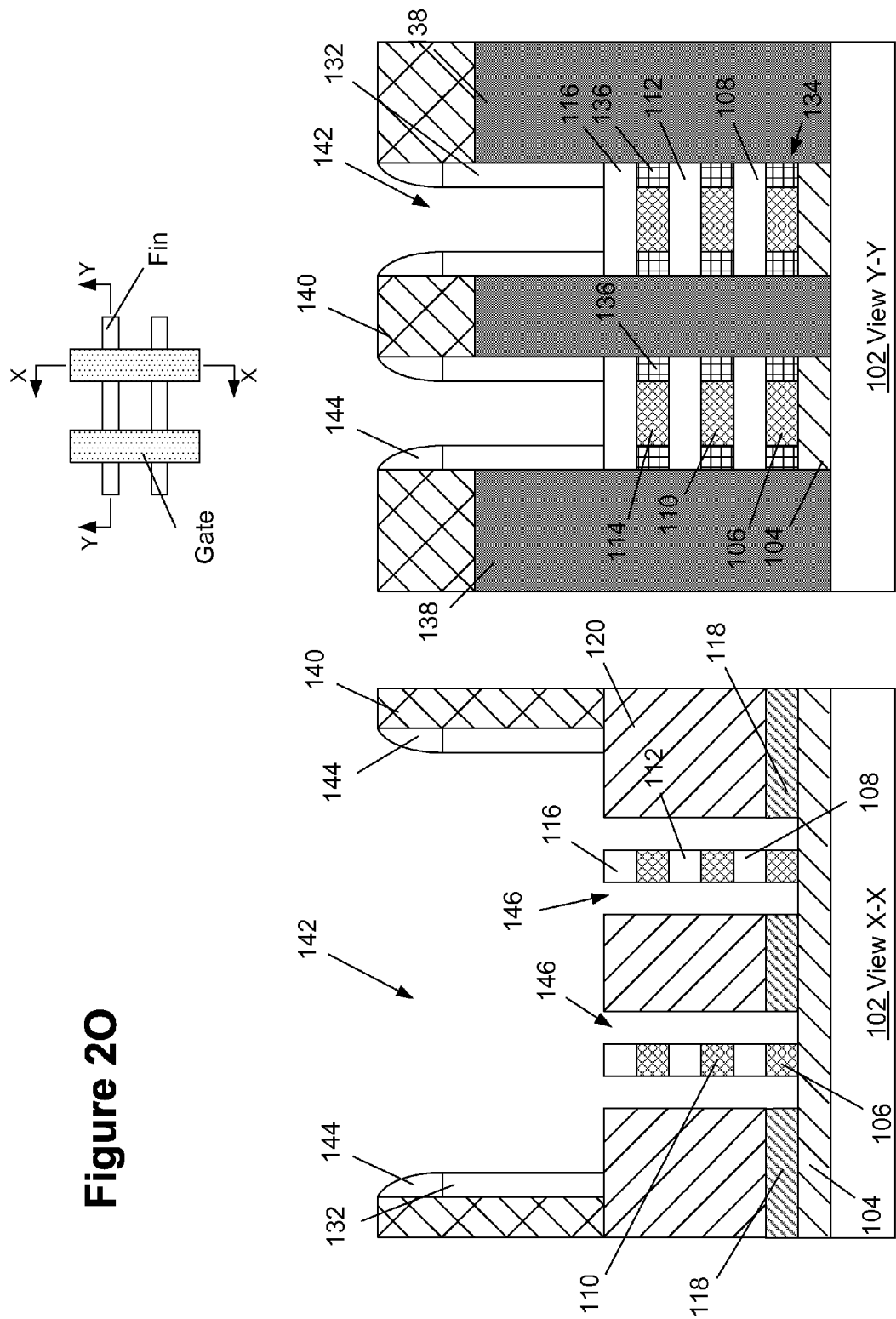

FIG. 2O depicts the device after an etching process, such as an anisotropic etching process, was performed to remove the exposed portions of the liner layer 118 selectively relative to the surrounding materials. This process operation results in the definition of cavities 146 within the gate cavity 142.

FIG. 2P depicts the device after an etching process was performed through the gate cavity 142 to remove the material layers 106, 110, and 114 selectively relative to the layers 104, 108, 112 and 116 and the material regions 136. The layers 108, 112 and 116 will constitute nanowires for the devices when fabrication is complete. That is, at this point in the process flow, a plurality of laterally spaced apart nanowire structures 147, each of which are comprised of the plurality of vertically spaced-apart nanowires (108, 112 and 116). Also note that the layer of insulating material 120 is positioned between the laterally spaced-apart nanowire structures.

Figure 2Q:
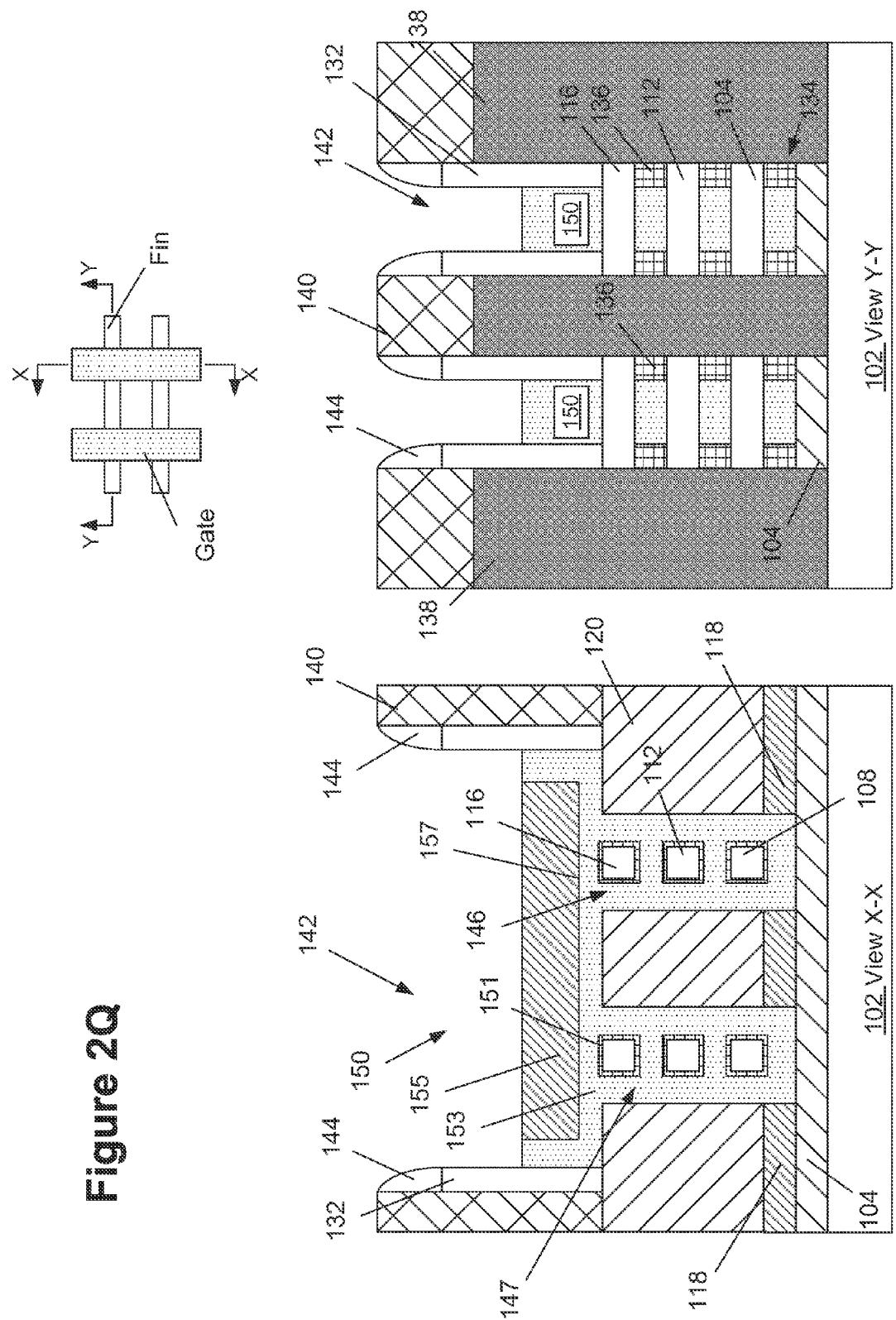

FIG. 2Q depicts the device after an illustrative and schematically depicted replacement gate structure 150 was formed in the gate cavity 142 and around the vertically spaced-apart nanowires 108, 112 and 116 for each of the nanowire structures 147. The replacement gate structure 150 depicted herein is intended to be representative in nature of any type of gate structure that may be employed in manufacturing integrated circuit products. Typically, in a replacement gate process flow, a pre-clean process will be performed in an attempt to remove all foreign materials from within the gate cavity 142 prior to forming the various layers of material that will become part of the replacement gate structure that is generally referred to with the reference number 150. For example, replacement gate structure 150 may be formed by sequentially depositing the materials of the replacement gate structure 150 in the gate cavity 142 and above the layer of material 140, performing a CMP process to remove excess materials above the layer 140, and then performing an etch-back recess etching process such that the upper surface of the gate structure 150 is at the desired height level within the gate cavity 142 so as to make room for the formation of a gate cap layer. As one specific example, which is only depicted in the X-X view of FIG. 2Q so as not to overly complicate the remaining drawings, the replacement gate structure 150 may include a high-k (k value greater than 10) gate insulation layer 151, such as hafnium oxide, that is deposited across the device and within the gate cavity 142 so as to form around each of the plurality of vertically spaced-apart nanowires 108, 112 and 116 for each of the nanowire structures 147. Thereafter, at least one work function adjusting metal layer 153, e.g., a layer of titanium nitride or TiAlC depending upon the type of transistor device being manufactured, is deposited across the device and within the gate cavity 142 so as to form around each of the plurality of vertically spaced-apart nanowires 108, 112 and 116 for each of the nanowire structures 147. Importantly, using the novel methods disclosed herein, the work function adjusting metal layer 153 is formed such that it is spans (in the gate width direction of the device) above both of the laterally spaced-apart nanowires structures 147 and the layer of insulating material 120. The work function adjusting metal layer 153 has a substantially planar surface 157 that is above the upper surface of the layer of insulating material 120 and above the uppermost surface of the upper nanowire 116 of the nanowire structures 147. Then, a bulk conductive material 155, such as tungsten or aluminum, may be deposited in the gate cavity 142 above the work-function adjusting metal layer(s) 153. Thereafter, an etch-back recess etching process is performed such that the upper surface of the replacement gate structure 150 is at the desired height level within the gate cavity 142 so as to make room for the formation of a gate cap layer.

Figure 2R:
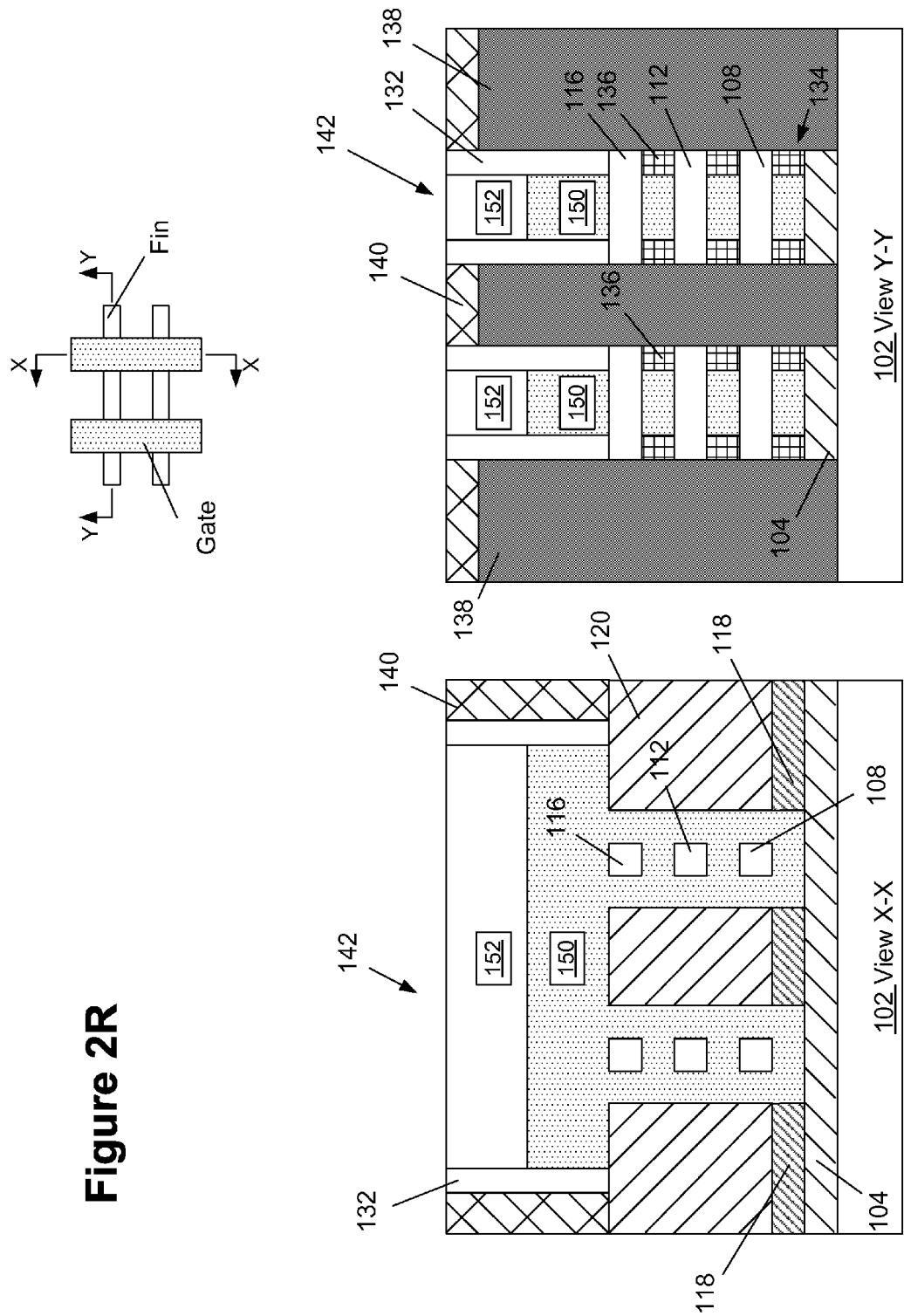

FIG. 2R depicts the device after an illustrative gate cap layer 152, e.g., silicon nitride, has been formed above the recessed replacement gate structure 150. The gate cap layer 152 may be formed by depositing a layer of the gate cap material across the device and above the recessed replacement gate structure 150, and performing another CMP process to remove excess material from above the layer of insulating material 140 so as to thereby define the gate cap layer 152.

Figure 2S:
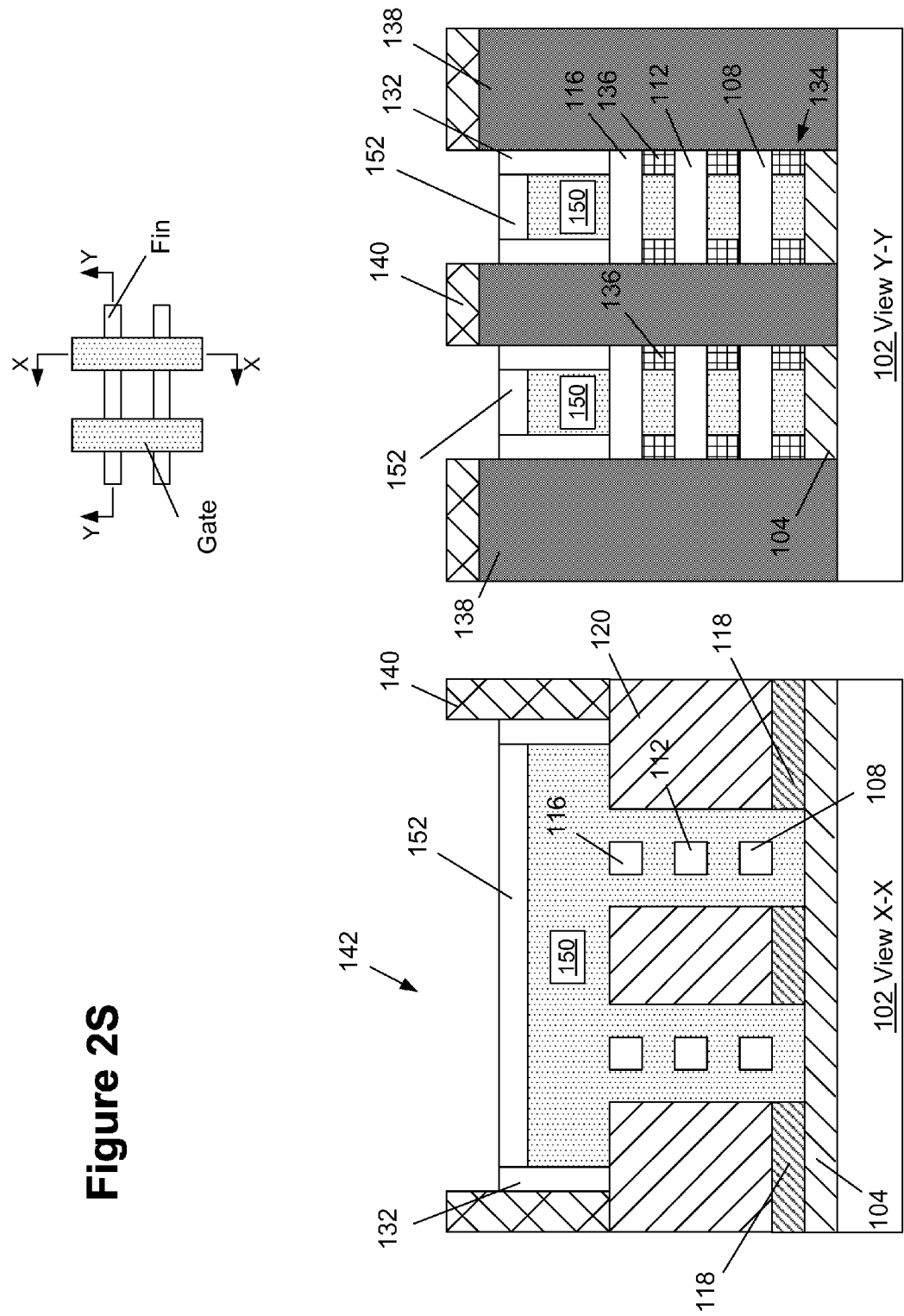

FIG. 2S depicts the product after a recess etching process, e.g., an anisotropic etching process, was performed to recess the gate cap layer 152 and the sidewall spacers 132, i.e., to reduce the thickness of the gate cap layer 152 and reduce the height of the spacers 132.

Figure 2T:
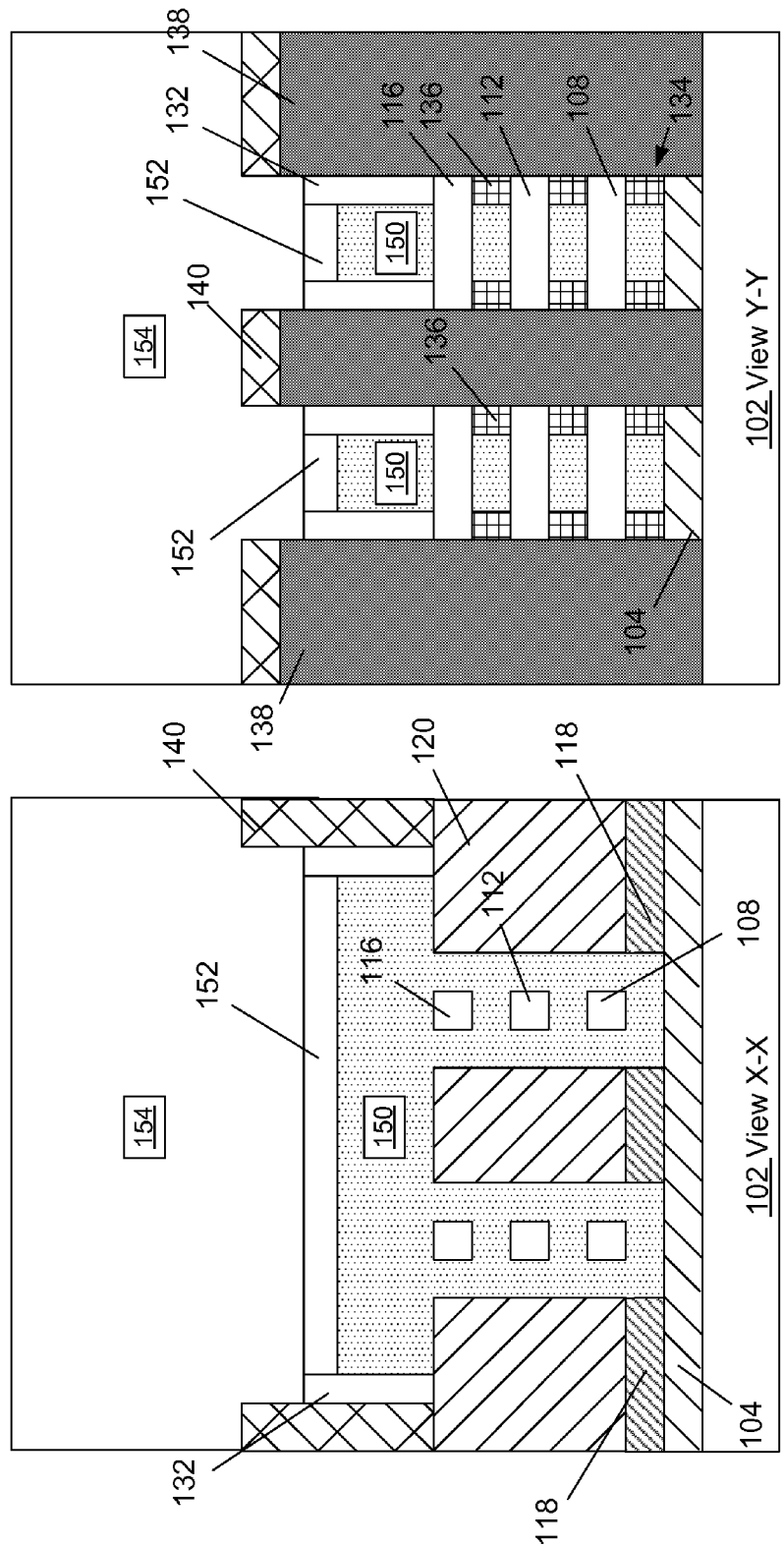

FIG. 2T depicts the product after another layer of insulating material 154 was deposited across the product. The layer of insulating material 154 may be comprised of a variety of different materials, such as silicon dioxide, etc., and it may be formed by performing a variety of techniques, e.g., CVD, etc. The thickness of the layer of insulating material 154 may vary depending upon the particular application. The layer of insulating material 154 may be made of the same or a different material than that of the layer of insulating material 140.

Figure 2U:
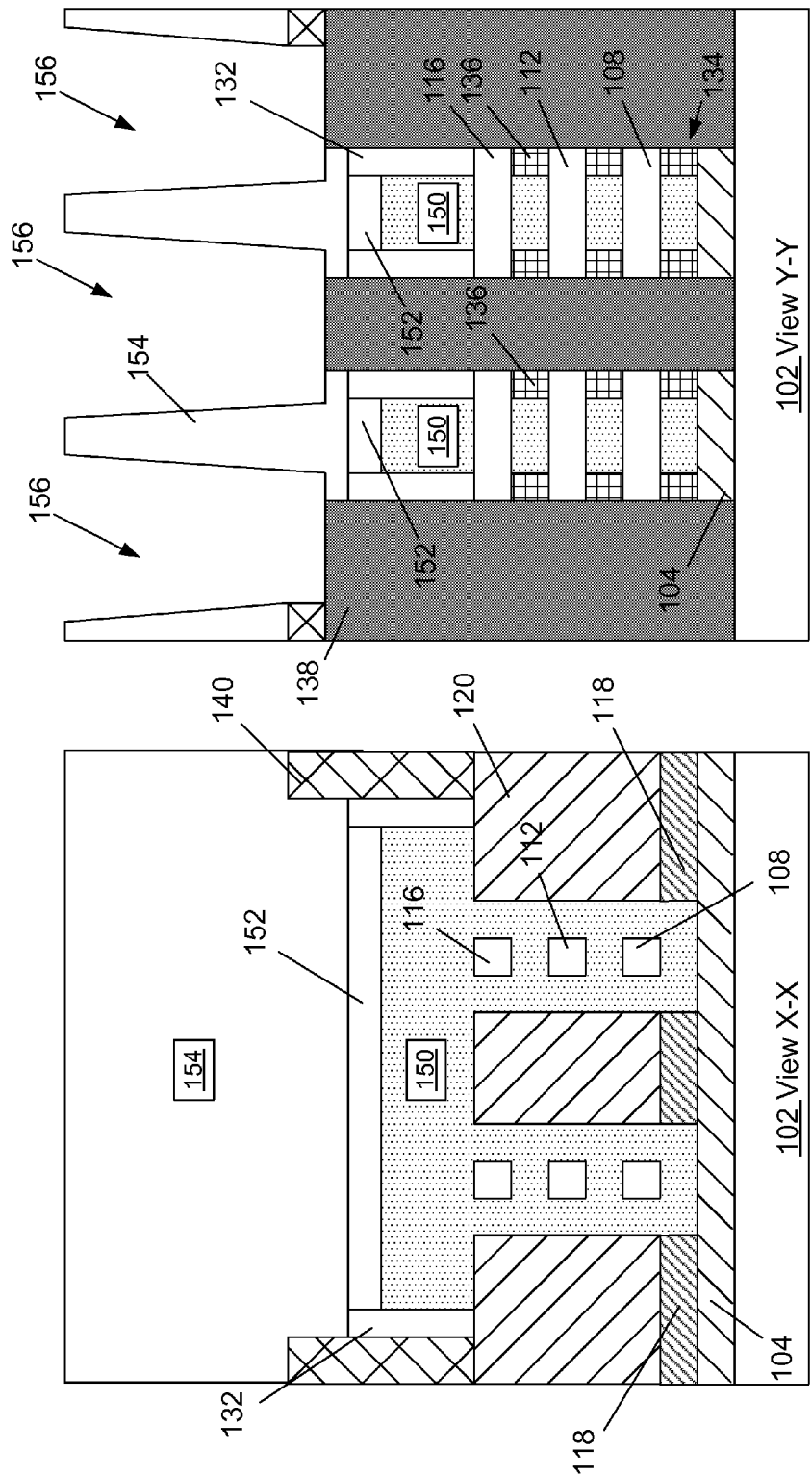

FIG. 2U depicts the device after one illustrative process flow wherein one or more etching processes, such as an anisotropic etching process, were performed through a patterned photoresist etch mask (not shown) to define a plurality of contact openings 156 that extend through the layers of insulating material 154, 152 and expose the upper surface of the first epi material 138. The size and shape of the openings 156 may vary depending upon the particular application.

Figure 2V:
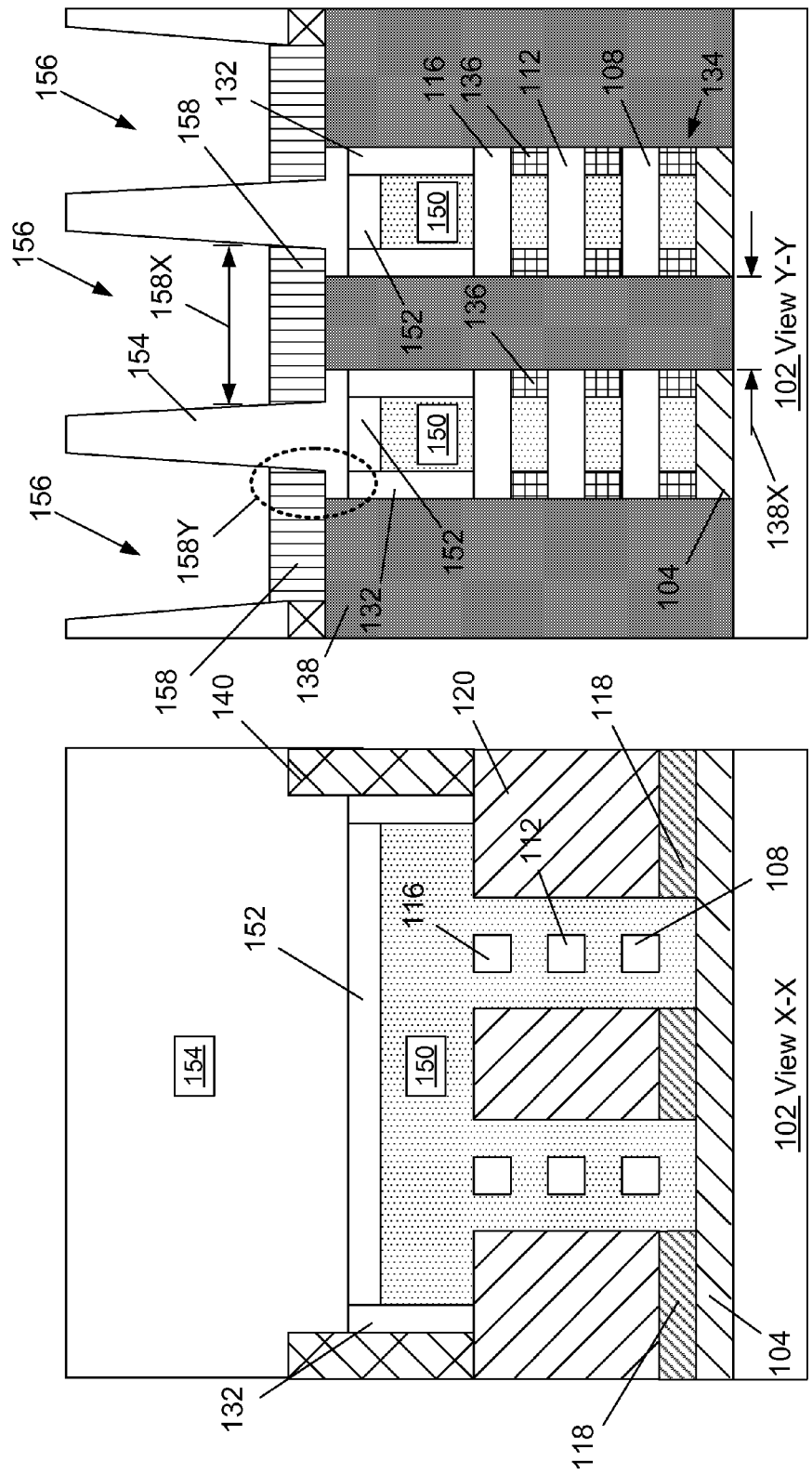

FIG. 2V depicts the product after additional epi semiconductor material 158 was formed on the first epi material 138 in the source/drain regions of the devices by performing known epitaxial growth processes. The second epi material 158 may be formed to any desired thickness (or height) above the first epi material 138. The second epi material regions 158 may be undoped or they may be doped (with an N- or P-type dopant material) in situ or they may be doped at a later time by performing one or more ion implantation processes. In the depicted example, the second or additional epi material regions 158 may have a thickness (or height above the first epi material 138) that falls within the range of about 10-30 nm.

The first and second epi materials 138, 158 may be made of the same or different epi materials. Note that the width 158X (view Y-Y) of the second epi material 158 (at the upper surface) is significantly wider than the width 138X of the first epi material at the point where the first epi material 138 contacts the substrate 102. In one example, the width 158X may be about 20-100% wider than the width 138X. Also note that portions of the second epi material 158 (as indicated in the dashed-line region 158Y) are positioned vertically above at least a portion of the spacers 132 that are formed adjacent the gate structure 150. In some cases, depending upon the width 158X of the second epi material 158, some of the second epi material 158 may be vertically positioned above a portion of the gate cap layer 152 and above a portion of the gate structure 150.

Figure 2W:
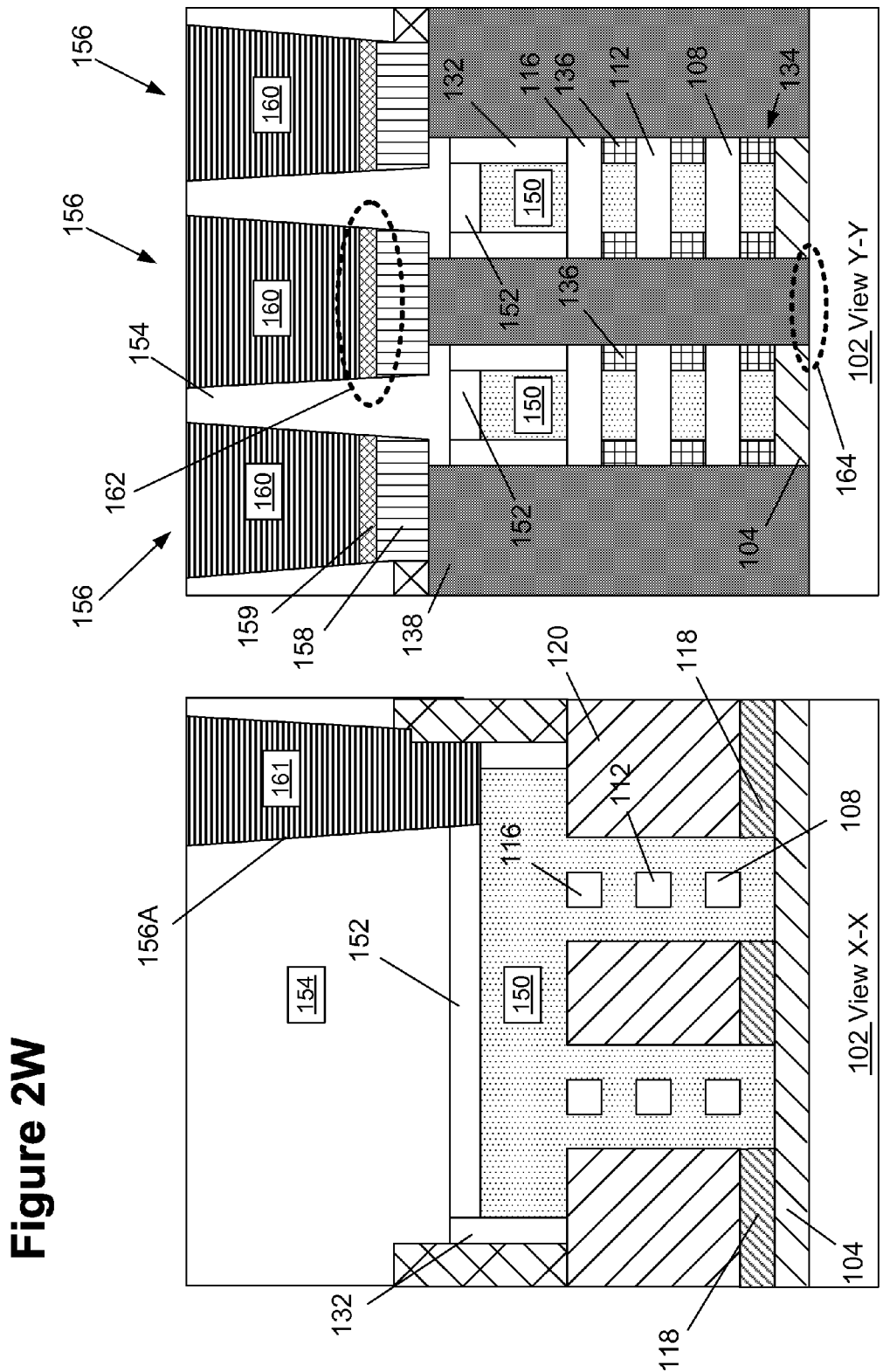

FIG. 2W depicts the product after several process operations were performed. First, metal silicide regions 159 were formed on the second epi material 158 within the contact openings 156. The metal silicide regions 159 may be formed of any metal silicide, they may be formed to any desired thickness and they may be formed using traditional metal silicide formation techniques. Note that, due to the increased width 158X (see FIG. 2V) of the second epi material 158, the contact area for the metal silicide regions 159 is much larger than would be the case in prior art processing wherein such metal silicide regions would have been formed on the upper surface of the first epi material 138 (at some location above the surface of the substrate 102) having a lesser width that is approximately the same as the width 138X shown in FIG. 2V (see the dashed-line regions 162 versus 164). Additionally, using the methods disclosed herein, the second epi material 158 may be formed to virtually any desired thickness. In turn, the metal silicide regions 159 can be formed to any desired thickness as well, as there is no concern with consuming too much of the epi material when the metal silicide regions are formed, as was sometimes the case with prior art processing techniques when very thin layers of epi material were formed on the source/drain regions of the devices. Increasing the contact area and/or the thickness of the metal silicide regions 159 can lead to a desirable decrease in contact resistance which can improve device performance.

With continuing reference to FIG. 2W, in one illustrative process flow, the next process operation involves forming a contact opening 156A in the layer of insulating material 154 and the gate cap layer 152 to expose the gate structure 150. Of course, depending upon the particular application, if desired, the gate contact may be formed before or at the same time as the source/drain contacts. Thereafter, a plurality of illustrative conductive contact structures 160, 161 were formed in the contact openings 156, 156A, respectively, such that they are conductively coupled to the epi material 138 in the source/drain regions of the device (via the metal silicide regions 159 and the second epi material 158) and to the gate structure 150, respectively. The contact structures 160, 161 are intended to be schematic and representative in nature, as they may be formed using any of a variety of different conductive materials and by performing traditional manufacturing operations. The contact structures 160, 161 may also contain one or more barrier layers (not depicted). In one illustrative example, the contact structures 160, 161 may be formed by depositing a liner, e.g., a titanium nitride liner, followed by overfilling the contact openings 156, 156A with a conductive material, such as tungsten. In other cases, the contact structures 160, 161 may be made of copper. Thereafter, a CMP process may be performed to planarize the upper surface of the layer of insulating material 154, which results in the removal of excess portions of the conductive materials positioned above the layer of insulating material 154 outside of the contact openings 156, 156A and the formation of the contact structures 160, 161.

Figure 2X:
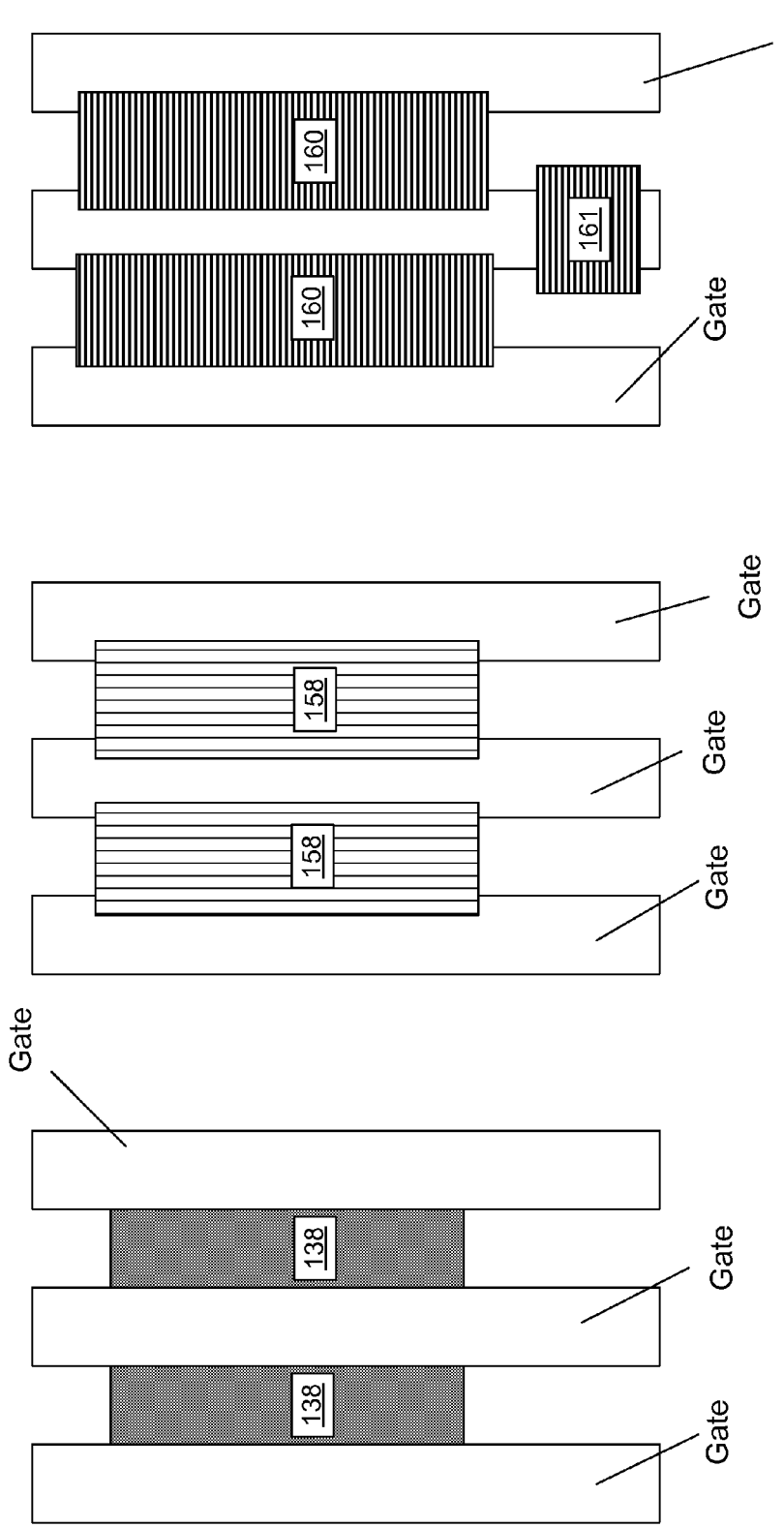

FIG. 2X is a sequence of plan views (from left to right) simplistically depicting the sequential formation of the first epi material 138, the second epi material 158 and the contact structures 160, 161. As depicted, the increased width of the second epi material 158 provides significant benefits (as discussed above) while still allowing sufficient room for formation of the gate contact structure 161.

FIGS. 3A-3D depict yet other illustrative novel methods disclosed herein of forming conductive contact structures for a semiconductor with a larger metal silicide contact area. Relative to the embodiment shown in FIGS. 2A-2X, wherein an illustrative nanowire device was formed, which in the depicted example is a gate-all-around (GAA) FinFET device. In general, the process flow used to form the FinFET device will be the same as that described above for the nanowire device. Thus, the following drawings will only show the FinFET device at certain points in the process flow.

Figure 3A:
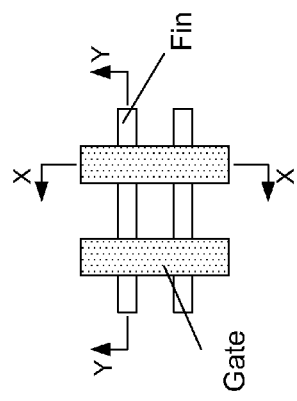
Figure 3A:
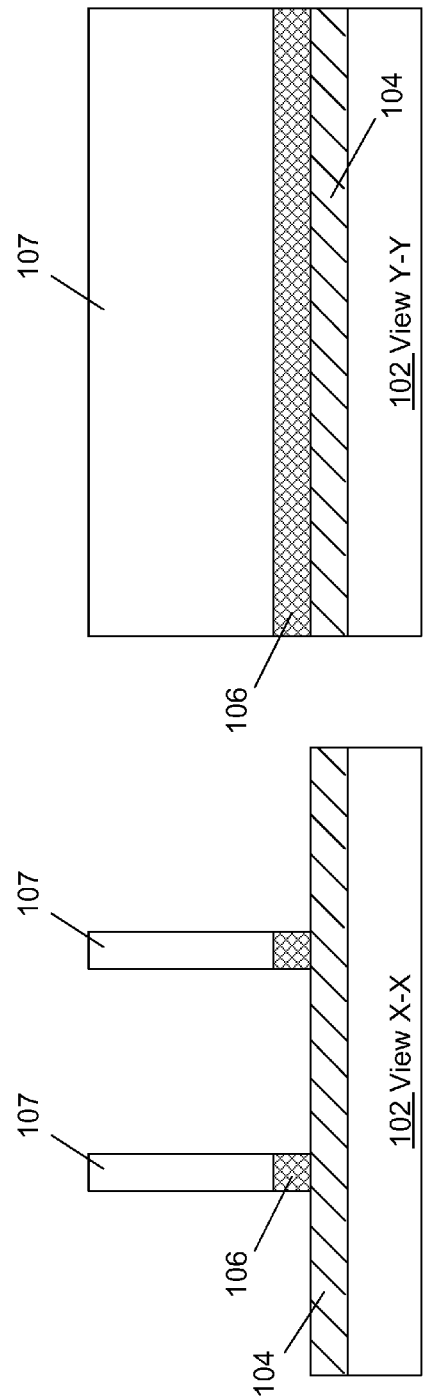

FIG. 3A depicts the device at a point of fabrication that corresponds to that shown in FIG. 2A. However, in this embodiment, the material layers 108, 110, 112, 114 and 116 have been replaced with a vertically-elongated fin structure 107. In this example, the fin 107 may be made of a material such as silicon. As before, the structure depicted in FIG. 3A may be achieved by performing one or more etching processes through a patterned etch mask (not shown).

Figure 3B:
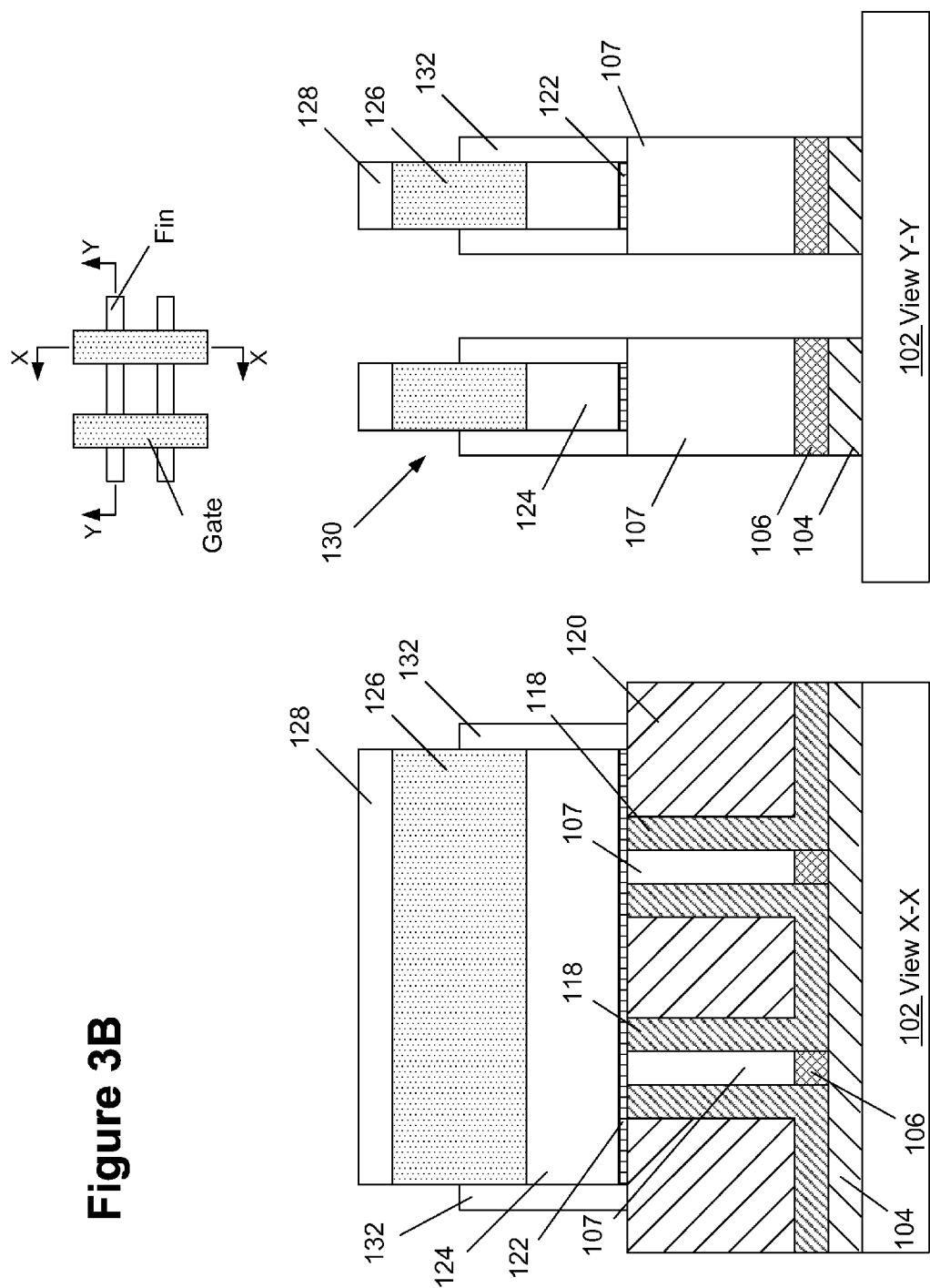

FIG. 3B depicts the FinFET device at a point of fabrication that corresponds to that shown in FIG. 2E, i.e., after the formation of the sacrificial gate structures 130 and the formation of the sidewall spacers 132.

Figure 3C:
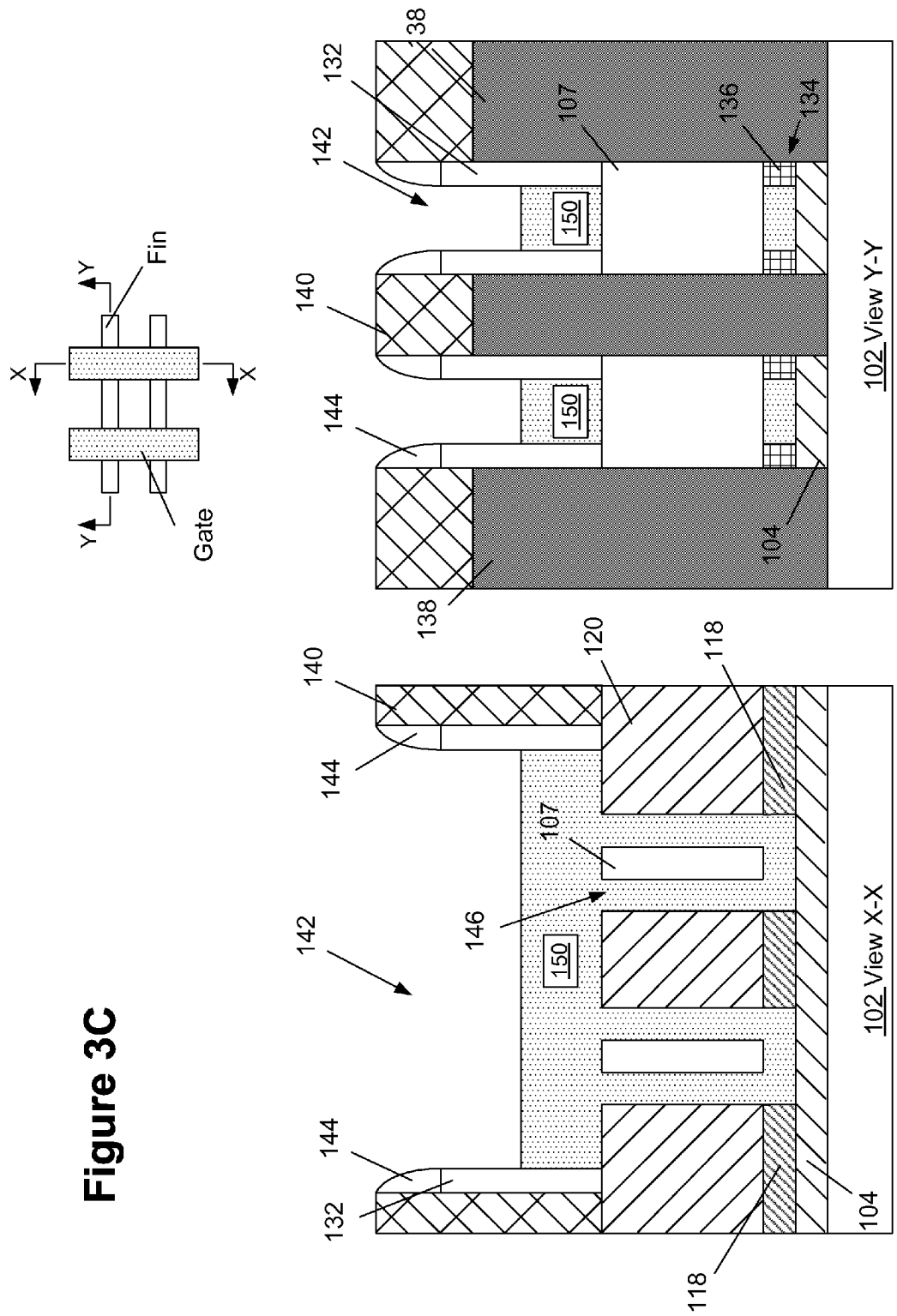

FIG. 3C depicts the FinFET device at a point of fabrication that corresponds to that shown in FIG. 2Q, i.e., after the formation of the gate structures 150.

FIG. 3D depicts the FinFET device at a point of fabrication that corresponds to that shown in FIG. 2W, i.e., after the formation of the metal silicide regions 159 and the contact structures 160, 161.

As will be appreciated and understood by those skilled in the art after a complete reading of the present application, there are several novel methods and devices disclosed herein, and the inventions disclosed herein may provide several benefits. Among other things, the inventions disclosed herein provide a means to maximize the silicide to source/drain contact area, and they also allow for an increased contact metal volume as compared to prior art processing techniques and devices. Moreover, since the gate structure 150 is "buried" under insulating material, there is more room for the formation of the various contact structures discussed above. Other advantages and benefits of the various inventions disclosed herein will be recognized and appreciated by those skilled in the art after a complete reading of the present application. Additionally, although the present invention has been disclosed in the context of forming a nanowire device and a FinFET device, the presently disclosed inventions may be employed on traditional planar transistor devices. Lastly, the inventions disclosed herein have been disclosed in the context of using a replacement gate process flow to form the gate structure 150. However, the methods and devices disclosed herein may also be employed when forming gate structures for any type of device using traditional gate-first processing techniques, e.g., where the final gate structure includes a polysilicon gate electrode and a silicon dioxide gate insulation layer.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming a transistor device comprising a gate structure, a gate cap layer positioned above said gate structure and a sidewall spacer positioned on opposite sidewalls of said gate structure, the method comprising:
    forming a first epi semiconductor material in a source/drain region of said transistor device, said first epi semiconductor material directly contacting a channel region of said transistor device and having a first lateral width at an upper surface thereof;
    forming a second epi semiconductor material on said first epi semiconductor material and above at least a portion of one of said gate cap layer or one of said sidewall spacers, said second epi semiconductor material extending laterally over and covering at least a portion of an uppermost end of said sidewall spacer and having a second lateral width at an upper surface thereof that is greater than said first lateral width; and
    forming a metal silicide region on the upper surface of said second epi semiconductor material.

2. The method of claim 1, wherein said first and second epi semiconductor materials are comprised of the same semiconductor material.

3. The method of claim 1, wherein, prior to forming said second epi semiconductor material, the method comprises forming a layer of insulating material above said gate cap layer and said sidewall spacers, and wherein the method further comprises:
    forming a contact opening in said layer of insulating material so as to expose said first epi semiconductor material; and
    forming said second epi semiconductor material within said contact opening on said first epi semiconductor material.

4. The method of claim 1, wherein said gate structure comprises a high-k gate insulation layer and a gate electrode comprised of at least one layer of metal.

5. The method of claim 1, wherein said gate structure comprises a silicon dioxide gate insulation layer and a gate electrode comprised of a layer of polysilicon.

6. The method of claim 1, further comprising forming a conductive contact structure on said metal silicide region.

7. The method of claim 1, wherein said device is one of a nanowire device or a FinFET device.

8. The method of claim 1, wherein a height level of said upper surface of said second epi semiconductor material above said channel region is greater than a height level of an upper surface of said gate structure above said channel.

9. The method of claim 1, further comprising forming a layer of insulating material above said transistor device, wherein a portion of said insulating material is positioned between said second epi semiconductor and said at least said portion of said uppermost end of said sidewall spacer.

10. A method of forming a transistor, comprising:
    forming a sacrificial gate structure above a semiconductor material;
    forming a sidewall spacer adjacent opposite sides of said sacrificial gate structure;
    forming a first epi semiconductor material in a source/drain region of said transistor;
    after forming said first epi semiconductor material, removing said sacrificial gate structure to define a replacement gate cavity defined by said sidewall spacers;
    forming a replacement gate structure and a gate cap layer within said replacement gate cavity;
    performing at least one recess etching process to reduce a thickness of said gate cap layer and a height of said sidewall spacers;
    forming a layer of insulating material above said recessed gate cap layer, said recessed sidewall spacers and said first epi semiconductor material;
    forming a contact opening in at least said layer of insulating material so as to expose an upper surface of said first epi semiconductor material;
    forming a second epi semiconductor material on said first epi semiconductor material and above at least a portion of one of said recessed gate cap layer or one of said recessed sidewall spacers; and
    forming a metal silicide region on the exposed upper surface of said second epi semiconductor material within said contact opening.

11. The method of claim 10, wherein said semiconductor material is a nanowire structure.

12. The method of claim 10, wherein said semiconductor material is a fin structure.

13. The method of claim 10, wherein said second epi semiconductor material is formed such that a portion of said second epi semiconductor material is positioned on said layer of insulating material.

14. The method of claim 10, wherein said replacement gate structure comprises a high-k gate insulation layer and a gate electrode comprised of at least one layer of metal.

15. The method of claim 10, wherein said first epi semiconductor material is formed such that it has a first lateral width at a upper surface thereof, and said second epi semiconductor material is formed such that it has a second lateral width at an upper surface thereof, said second lateral width being greater than said first lateral width.

16. The method of claim 10, further comprising forming a conductive contact structure on said metal silicide region within said contact opening.

17. A method of forming a nanowire device, comprising
    performing an etching process through a replacement gate cavity to form first and second stacked laterally spaced-apart nanowire structures, each of which is comprised of a plurality of vertically spaced-apart nanowires;
    forming a gate insulation layer within said replacement gate cavity such that it forms around each of said vertically spaced-apart nanowires of said first and second plurality of stacked nanowire structures;
    forming at least one work function adjusting metal layer within said replacement gate cavity such that it forms around each of said vertically spaced-apart nanowires of said first and second plurality of stacked nanowire structures and above an upper surface of a layer of insulating material positioned between said laterally spaced-apart first and second plurality of stacked nanowire structures, wherein said work function adjusting metal layer has an upper surface that is positioned above the upper surface of said layer of insulating material and above the uppermost nanowire in each of said first and second plurality of stacked nanowire structures;

forming at least one conductive material within said replacement gate cavity above the upper surface of said work function adjusting metal layer within said replacement gate cavity;

forming a gate cap layer within said replacement gate cavity above said at least one conductive material; and forming a first epi semiconductor material in a source/drain region of said nanowire device, said first epi semiconductor material directly contacting a portion of each of said vertically spaced-apart nanowires of said first and second plurality of stacked nanowire structures, wherein said first epi semiconductor material covers an entirety of an outer sidewall surface of a sidewall spacer that laterally defines said replacement gate cavity.

18. The method of claim 17, wherein said first epi semiconductor material has a first lateral width at an upper surface thereof, the method further comprising:

forming a second epi semiconductor material on said upper surface of said first epi semiconductor material, said second epi semiconductor material having a second lateral width at an upper surface thereof that is greater than said first lateral width, wherein said upper surface of said second epi semiconductor material is at a height level above said first and second stacked laterally spaced-apart nanowire structures that is greater than that of an uppermost end of said sidewall spacer; and forming a metal silicide region on said upper surface of said second epi semiconductor material.

19. The method of claim 18, wherein said second epi semiconductor material extends laterally over and covers at least a portion of said uppermost end of said sidewall spacer.

20. A method of forming a transistor device comprising a gate structure, a gate cap layer positioned above said gate structure and a sidewall spacer positioned adjacent said gate structure on opposite sides thereof, the method comprising:

forming a first epi semiconductor material in a source/drain region of said transistor device, said first epi semiconductor material having a first lateral width at an upper surface thereof;

forming a layer of insulating material above said gate cap layer and said sidewall spacers;

forming a contact opening in said layer of insulating material so as to expose said first epi semiconductor material;

forming a second epi semiconductor material within said contact opening on said first epi semiconductor material and above at least a portion of one of said gate cap layer or one of said sidewall spacers, said second epi semiconductor material having a second lateral width at an upper surface thereof that is greater than said first lateral width; and forming a metal silicide region on said upper surface of said second epi semiconductor material.

21. A method of forming a nanowire device, comprising performing an etching process through a replacement gate cavity to form first and second stacked laterally spaced-apart nanowire structures, each of which is comprised of a plurality of vertically spaced-apart nanowires;

forming a gate insulation layer within said replacement gate cavity such that it forms around each of said vertically spaced-apart nanowires of said first and second plurality of stacked nanowire structures;

forming at least one work function adjusting metal layer within said replacement gate cavity such that it forms around each of said vertically spaced-apart nanowires of said first and second plurality of stacked nanowire structures and above an upper surface of a layer of insulating material positioned between said laterally spaced-apart first and second plurality of stacked nanowire structures, wherein said work function adjusting metal layer has an upper surface that is positioned above the upper surface of said layer of insulating material and above the uppermost nanowire in each of said first and second plurality of stacked nanowire structures;

forming at least one conductive material within said replacement gate cavity above the upper surface of said work function adjusting metal layer within said replacement gate cavity;

forming a gate cap layer within said replacement gate cavity above said at least one conductive material;

forming a first epi semiconductor material in a source/drain region of said nanowire device, said first epi semiconductor material directly contacting a portion of each of said vertically spaced-apart nanowires of said first and second plurality of stacked nanowire structures, wherein said first epi semiconductor material has a first lateral width at an upper surface thereof and covers at least a portion of an outer sidewall surface of a sidewall spacer that laterally defines said replacement gate cavity;

forming a second epi semiconductor material on said upper surface of said first epi semiconductor material, said second epi semiconductor material having a second lateral width at an upper surface thereof that is greater than said first lateral width, wherein said upper surface of said second epi semiconductor material is at a height level above said first and second stacked laterally spaced-apart nanowire structures that is greater than that of an uppermost end of said sidewall spacer; and forming a metal silicide region on said upper surface of said second epi semiconductor material.

* * * * *